US 8,766,455 B2

(12) United States Patent
Jeong et al.

(10) Patent No.: US 8,766,455 B2
(45) Date of Patent: Jul. 1, 2014

(54) STACKED SEMICONDUCTOR DEVICES AND FABRICATION METHODS THEREOF

(75) Inventors: SeYoung Jeong, Gyeonggi-do (KR); Sunpil Youn, Seoul (KR); Hogeon Song, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/239,885

(22) Filed: Sep. 22, 2011

(65) Prior Publication Data

US 2012/0112359 A1    May 10, 2012

(30) Foreign Application Priority Data

Nov. 8, 2010 (KR) .................. 10-2010-0110534

(51) Int. Cl.
*B23B 15/00* (2006.01)
*H01L 23/488* (2006.01)

(52) U.S. Cl.
USPC ............ 257/774; 257/E23.011; 257/E23.141; 257/777; 257/686; 257/685; 257/728; 257/724; 257/773; 257/E23.023; 257/772; 428/646

(58) Field of Classification Search
USPC .......... 257/774, 777, E23.011, E23.141, 686, 257/685, 728, 724, 773, 772, E23.023; 428/646
See application file for complete search history.

(56) References Cited

U.S. PATENT DOCUMENTS

| | | | |
|---|---|---|---|
| 6,388,941 B2* | 5/2002 | Otori et al. ............. | 365/230.08 |
| 6,804,256 B2* | 10/2004 | Chang ..................... | 370/468 |
| 7,263,010 B2* | 8/2007 | Iwai et al. ............... | 365/200 |
| 7,313,038 B2* | 12/2007 | Otsuka .................... | 365/201 |
| 7,786,572 B2 | 8/2010 | Chen | |
| 8,076,766 B2* | 12/2011 | Ikeda et al. ............. | 257/686 |
| 8,373,202 B2* | 2/2013 | Lin et al. ................ | 257/211 |
| 8,436,455 B2* | 5/2013 | Eun ......................... | 257/686 |
| 2002/0006062 A1* | 1/2002 | Otori et al. ............. | 365/189.07 |
| 2007/0181991 A1* | 8/2007 | Ishino et al. ........... | 257/686 |
| 2009/0218671 A1 | 9/2009 | Kuwabara | |
| 2009/0283898 A1* | 11/2009 | Janzen et al. ........... | 257/698 |
| 2009/0294990 A1* | 12/2009 | Ishino et al. ........... | 257/777 |
| 2010/0060310 A1* | 3/2010 | Laisne et al. ........... | 326/10 |
| 2011/0026232 A1* | 2/2011 | Lin et al. ................ | 361/760 |
| 2011/0084385 A1* | 4/2011 | Itaya et al. ............. | 257/737 |
| 2012/0068360 A1* | 3/2012 | Best ....................... | 257/774 |

(Continued)

FOREIGN PATENT DOCUMENTS

| JP | 2009-239256 | 10/2009 |
|---|---|---|
| JP | 4480417 | 6/2010 |
| KR | 10-2007-0040869 | 4/2007 |

OTHER PUBLICATIONS

English Abstract for Publication No. 10-2007-0040869.

(Continued)

*Primary Examiner* — Alexander Oscar Williams
(74) *Attorney, Agent, or Firm* — F. Chau & Associates, LLC

(57) ABSTRACT

A semiconductor device includes a first semiconductor chip, a first connection structure disposed on a first side of the first semiconductor chip, a second semiconductor chip disposed on a second side of the first semiconductor chip, and a second connection structure disposed between the first and second semiconductor chips, wherein a number of the second connection structures is less than a number of the first connection structures.

17 Claims, 34 Drawing Sheets

(56) References Cited

U.S. PATENT DOCUMENTS

| | | | |
|---|---|---|---|
| 2012/0069530 A1* | 3/2012 | Inoue et al. | 361/735 |
| 2012/0086109 A1* | 4/2012 | Kim et al. | 257/659 |
| 2012/0163413 A1* | 6/2012 | Kim et al. | 374/152 |
| 2012/0190193 A1* | 7/2012 | Shau | 438/667 |
| 2012/0211885 A1* | 8/2012 | Choi et al. | 257/737 |
| 2012/0305917 A1* | 12/2012 | Yoko et al. | 257/48 |
| 2013/0147038 A1* | 6/2013 | Ishikawa | 257/737 |

OTHER PUBLICATIONS

English Abstract for Publication No. 2009-239256.
English Abstract for Publication No. JP 4480417.

\* cited by examiner

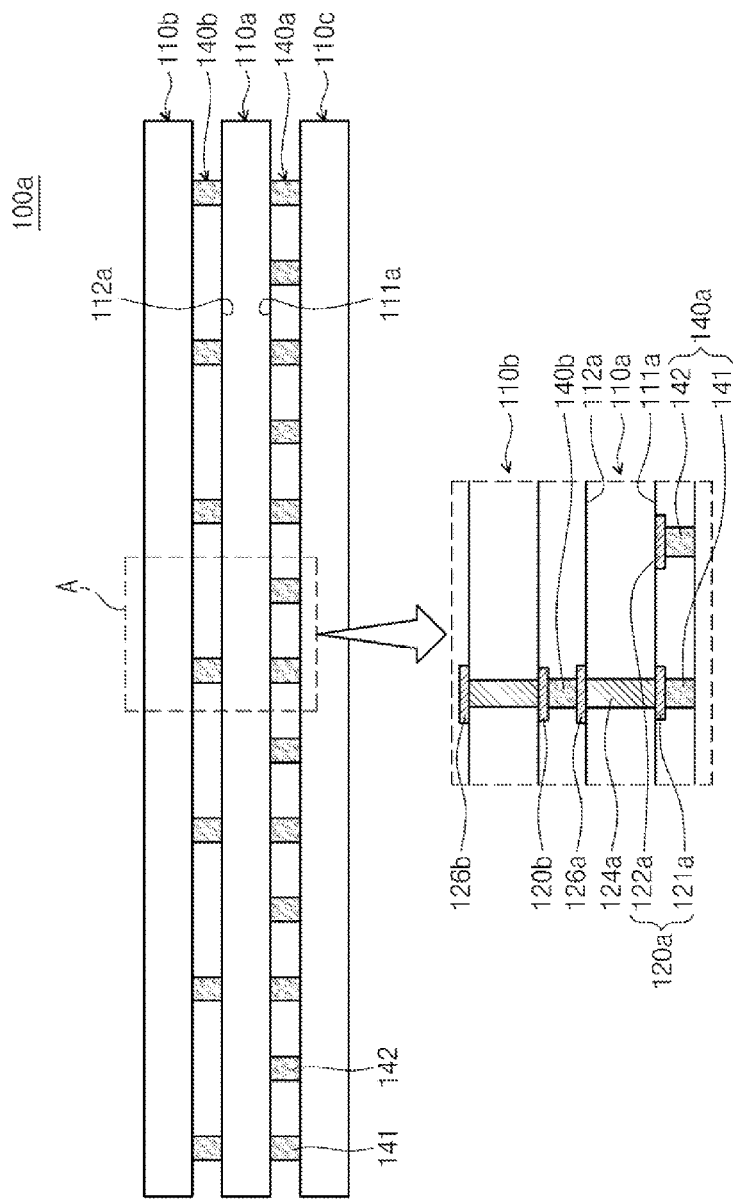

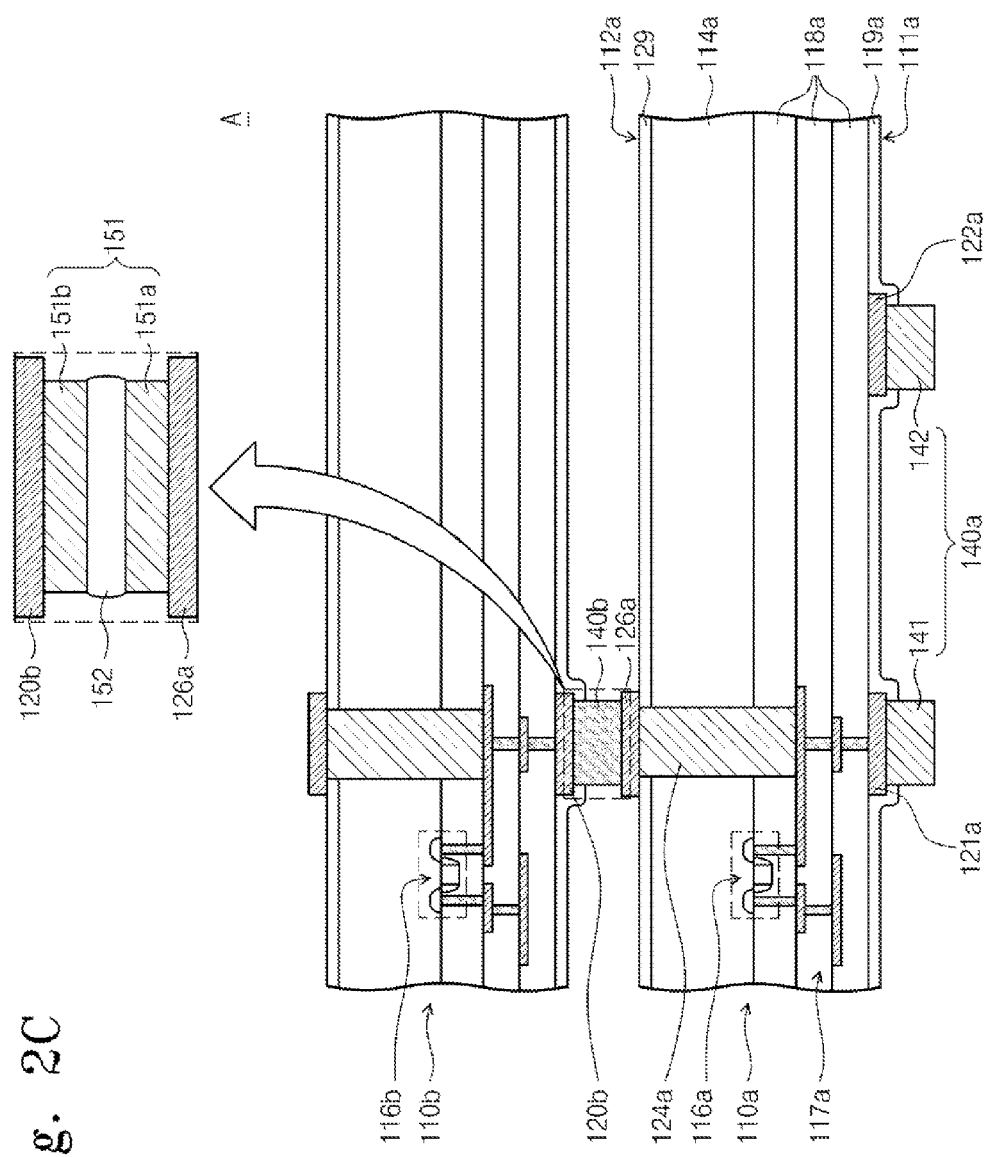

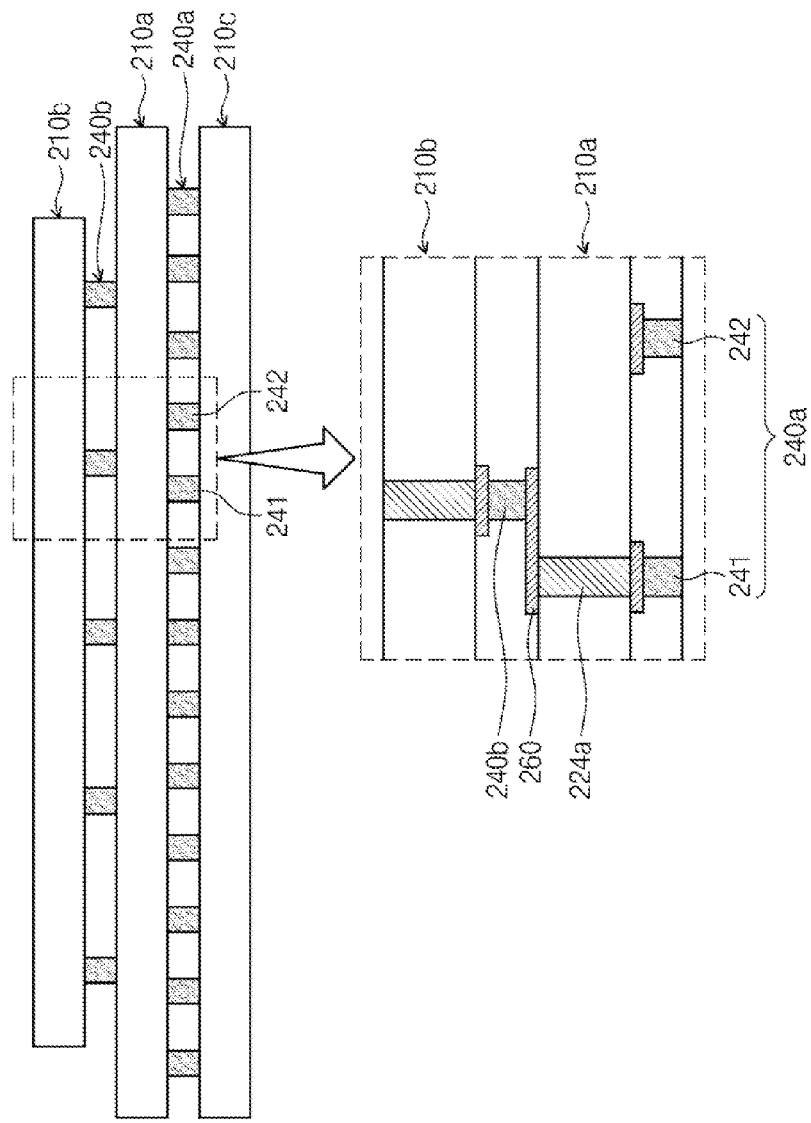

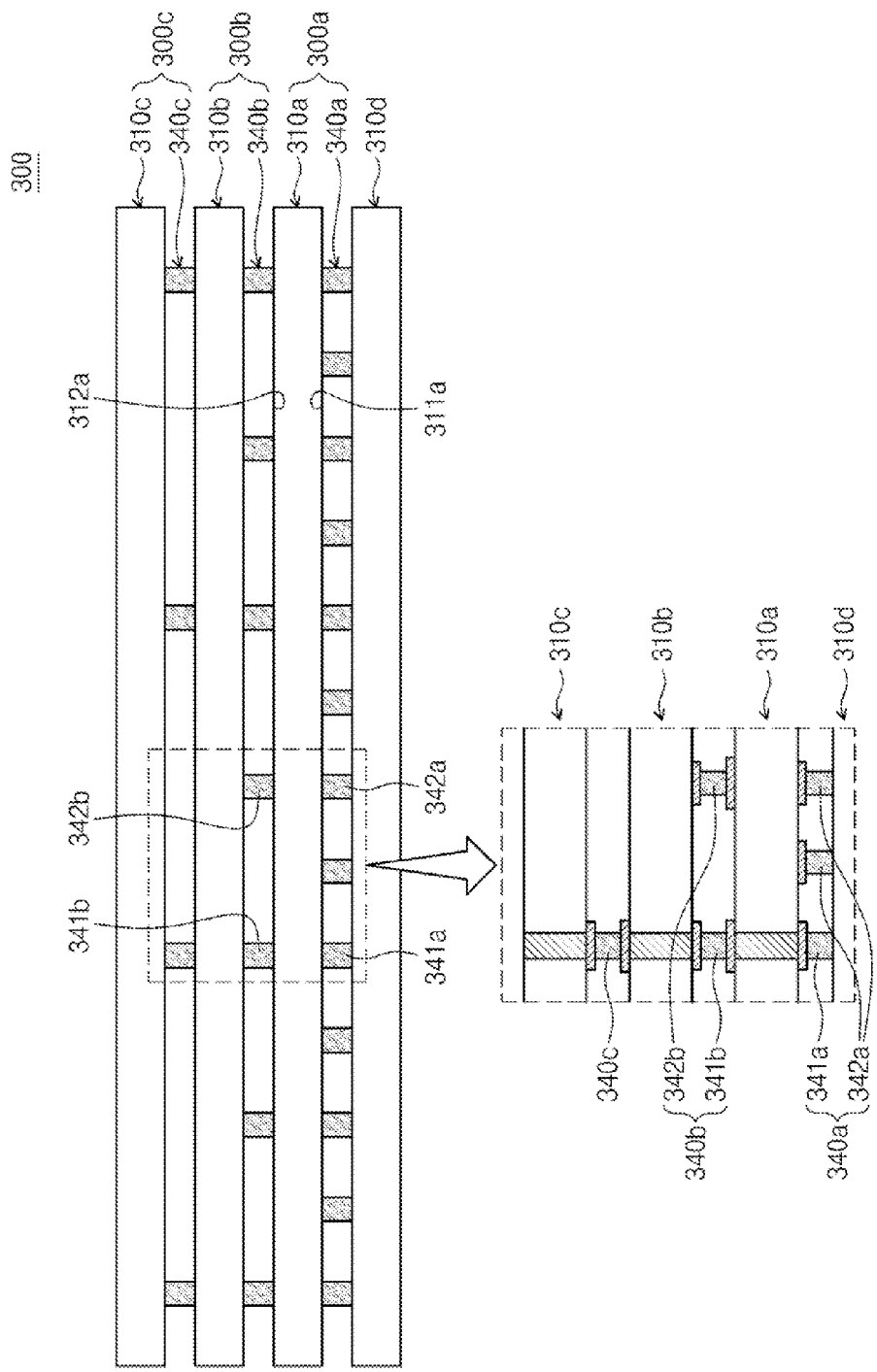

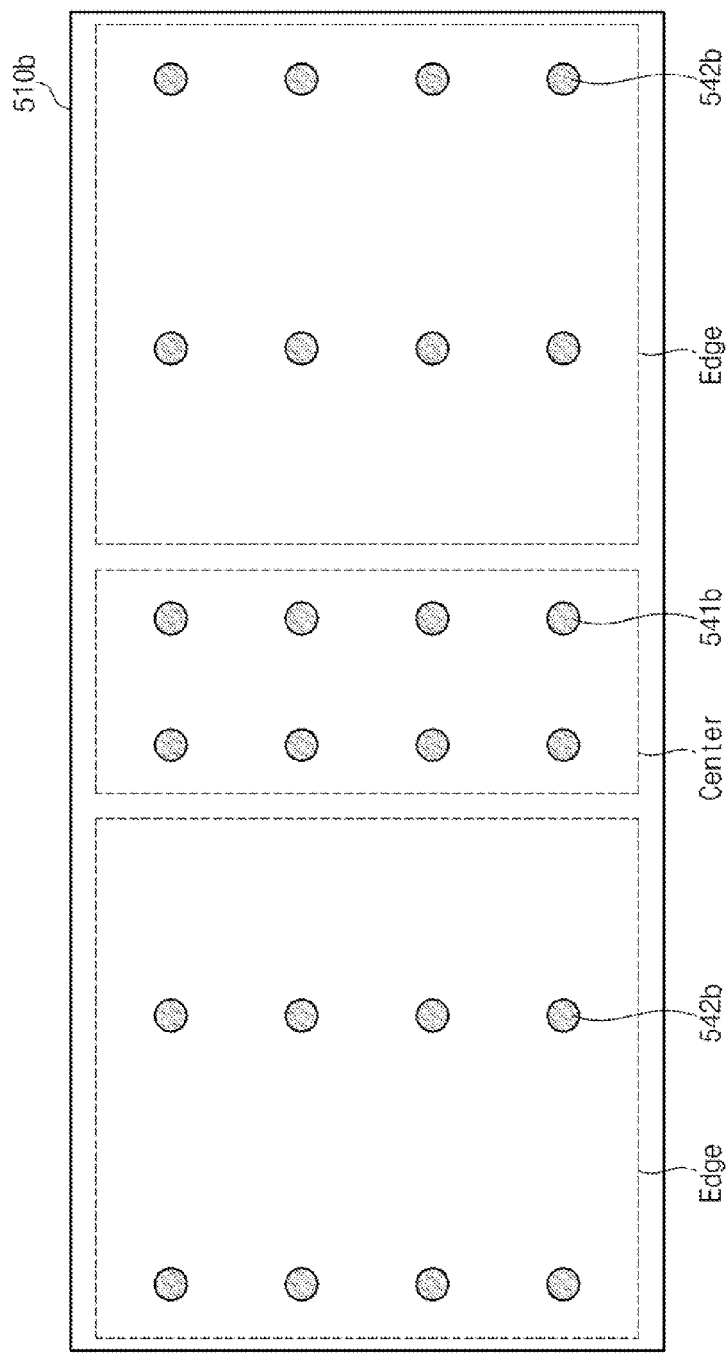

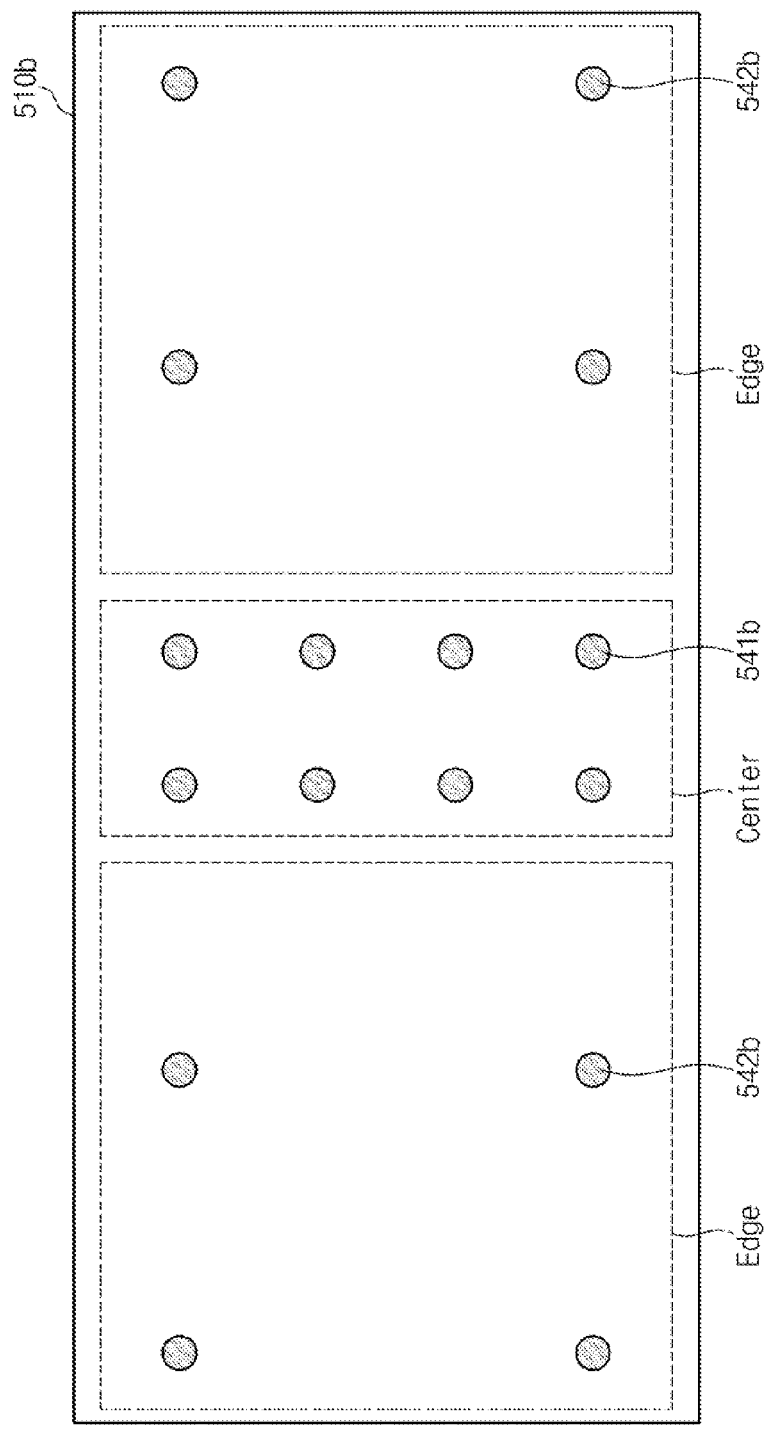

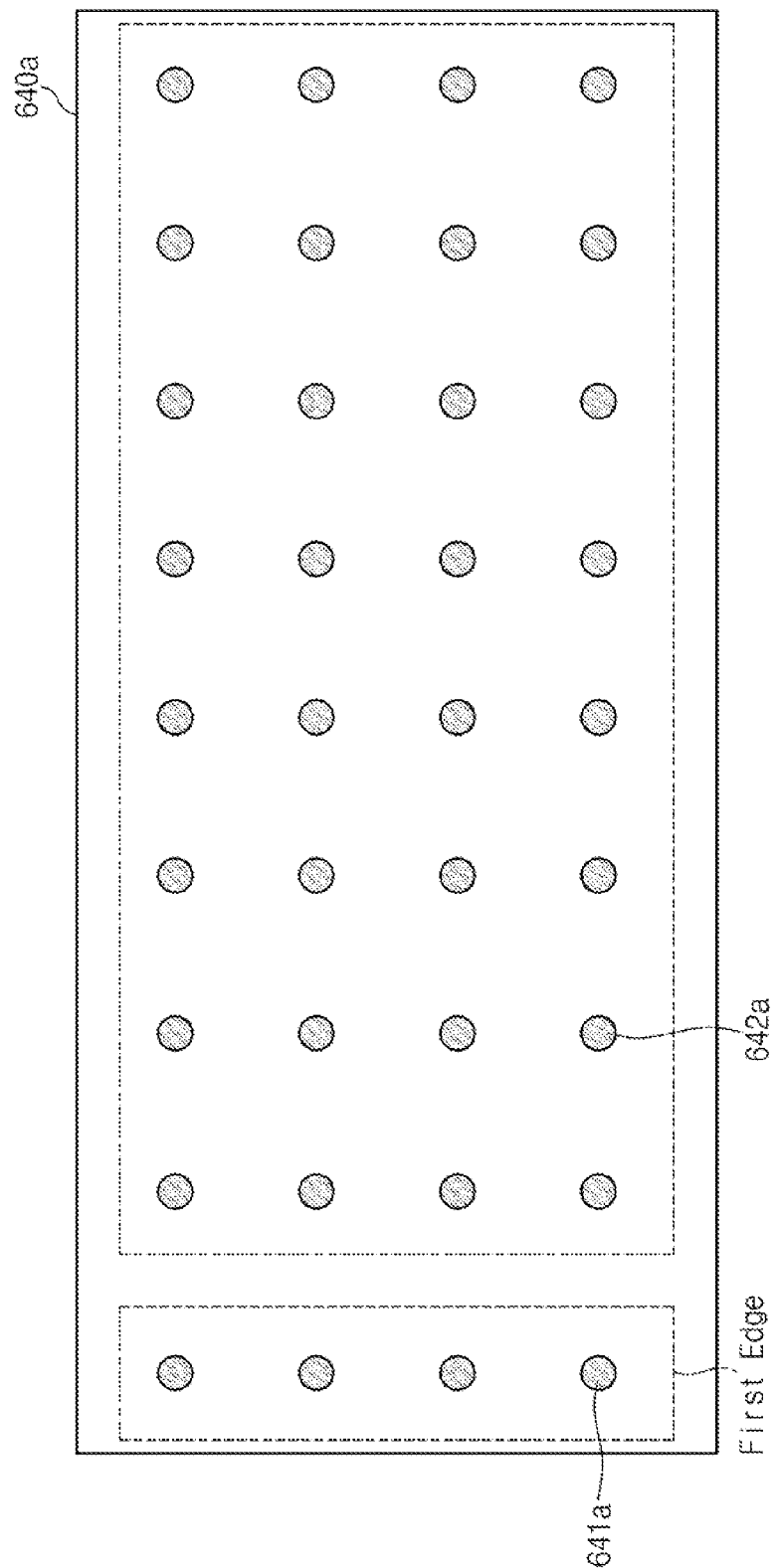

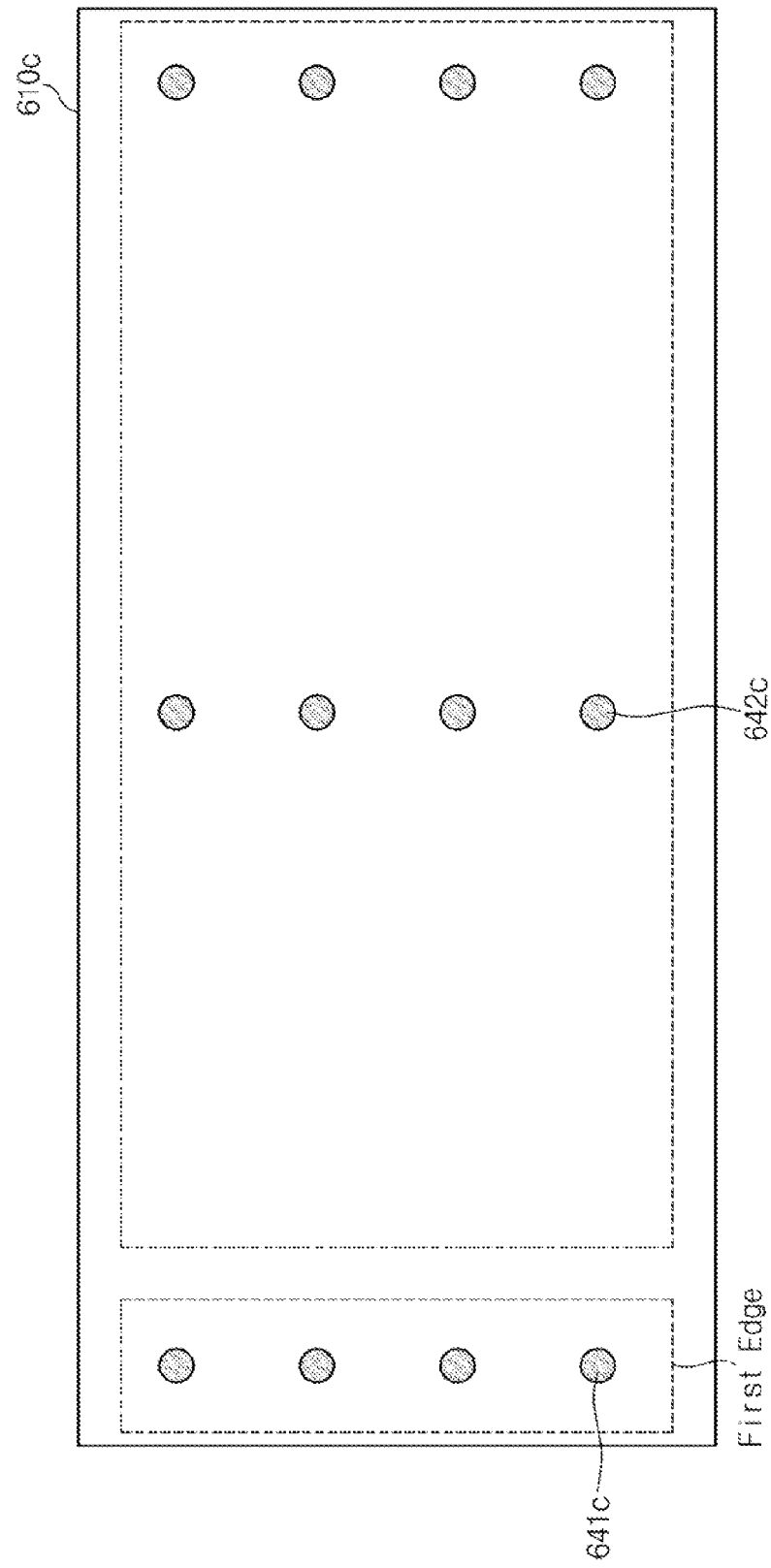

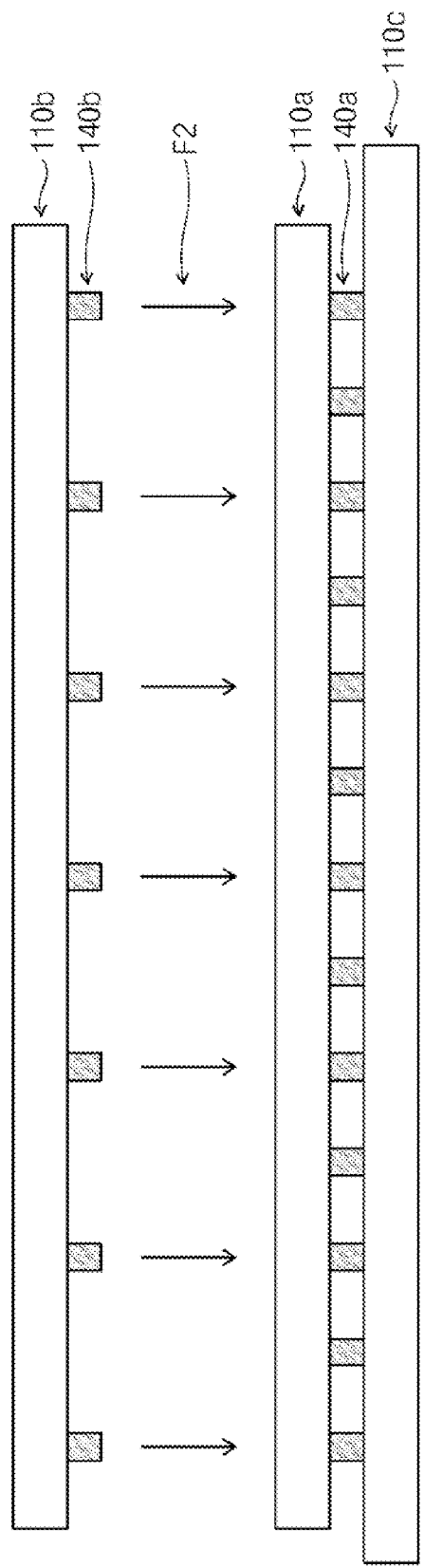

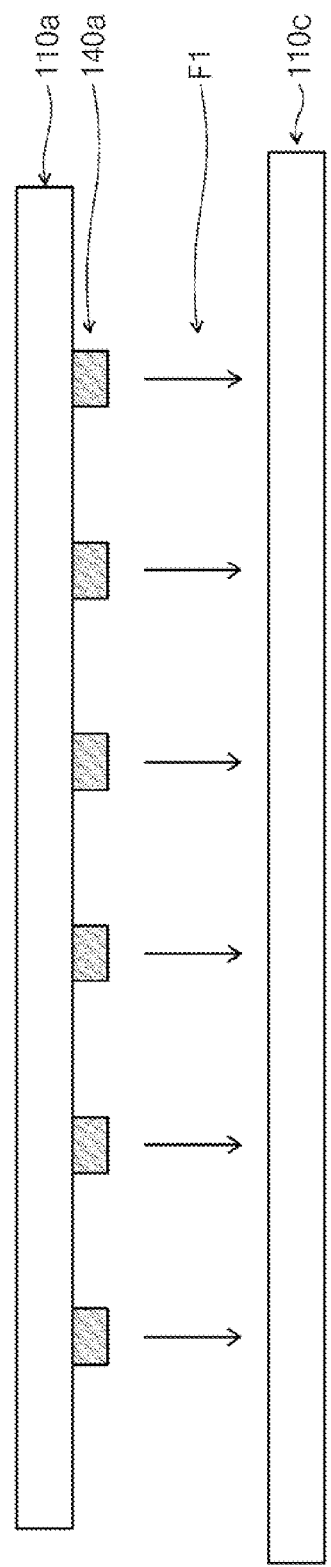

STACKED SEMICONDUCTOR DEVICES AND FABRICATION METHODS THEREOF

CROSS-REFERENCE TO RELATED APPLICATIONS

This U.S. non-provisional patent application claims priority under 35 U.S.C. §119 of Korean Patent Application No. 10-2010-0110534, filed on Nov. 8, 2010, the entire contents of which are hereby incorporated by reference.

BACKGROUND

1. Technical Field

The present disclosure herein relates to a semiconductor device and a fabrication method thereof 2. Discussion of Related Art Advances in semiconductor device technology for use in high-performance electronic systems are typically directed to increasing capacity and/or speed. Various attempts are being made for integrating circuits having various functions in smaller semiconductor devices and operating the semiconductor devices at a higher speed.

In one proposed system for integrating circuits, semiconductor chips are stacked for the high integration and high-performance operations of semiconductor devices. For example, a multi-chip package may include a plurality of stacked chips mounted in one semiconductor package. In another example, a System-in Package (SiP) may include stacked different chips operating as one system. When a plurality of semiconductor chips are stacked sequentially, a method for stably connecting the stacked semiconductor chips is needed.

SUMMARY

According to an exemplary embodiment of the present disclosure, a semiconductor device includes a first semiconductor chip comprising an internal circuit, a plurality of first connection structures disposed on a first side of the first semiconductor chip comprising at least one connection element electrically connected to the internal circuit of the first semiconductor chip and at least one auxiliary element electrically insulated from the internal circuit of first semiconductor chip, a second semiconductor chip disposed on a second side of the first semiconductor chip, and a plurality of second connection structures disposed between the first and second semiconductor chips and comprising at least one connection element electrically connected to the internal circuits of the first and second semiconductor chips, wherein a number of the second connection structures is less than a number of the first connection structures.

In an exemplary embodiment, the second connection structures further include at least one auxiliary element electrically insulated from the internal circuit of second semiconductor chip and a number of the auxiliary elements in the second connection structures may be less than a number of the auxiliary elements in the first connection structures.

In an exemplary embodiment, a number of the connection elements in the first connection structures may be the same as a number of the connection elements in the second connection structures.

In an exemplary embodiment, the number of the second connection structures may be 50% to 90% of the number of the first connection structures.

In an exemplary embodiment, the number of the auxiliary elements of the second connection structures may be 50% to 90% of the number of the auxiliary elements of the first connection structures.

According to an exemplary embodiment of the present disclosure, a semiconductor device includes a lower structure, and a plurality of semiconductor chip floors sequentially stacked on the lower structure, wherein each of the semiconductor chip floors includes a semiconductor chip and a connection structure disposed at a lower surface of the semiconductor chip, and wherein an area of the connection structure of each of the plurality of semiconductor chip floors is less than that of any one of the semiconductor chip floors disposed nearer the lower structure.

According to an exemplary embodiment of the present disclosure, a method includes connecting a first semiconductor chip to a second semiconductor chip by a plurality of first connection structures to form a stack and connecting the stack to a substrate by a plurality of second connection structures, wherein one of a number of the first connection structures is different than a number of the second connection structures, or a contact area of the first connection structures with the first and second semiconductor chips is different than a contact area of the second connection structures with the stack and the substrate.

BRIEF DESCRIPTION OF THE DRAWINGS

The accompanying drawings are included to provide a further understanding of exemplary embodiments of the present disclosure. In the drawings:

FIGS. 2A to 2D are sectional views illustrating semiconductor devices according to some embodiments of the present disclosure;

FIGS. 3A and 3B are sectional views illustrating semiconductor devices according to other embodiments of the present disclosure;

FIGS. 9A, 9B, 10 and 11 are plan views exemplarily illustrating connection structures shown along dot lines of FIG. 8;

FIGS. 12A to 12C are sectional views illustrating a method of fabricating a semiconductor device, according to an embodiment of the present disclosure;

FIGS. 13A and 13B are sectional views illustrating a method of fabricating a semiconductor device, according to another embodiment of the present disclosure;

DETAILED DESCRIPTION OF THE EMBODIMENTS

Figure 1A:
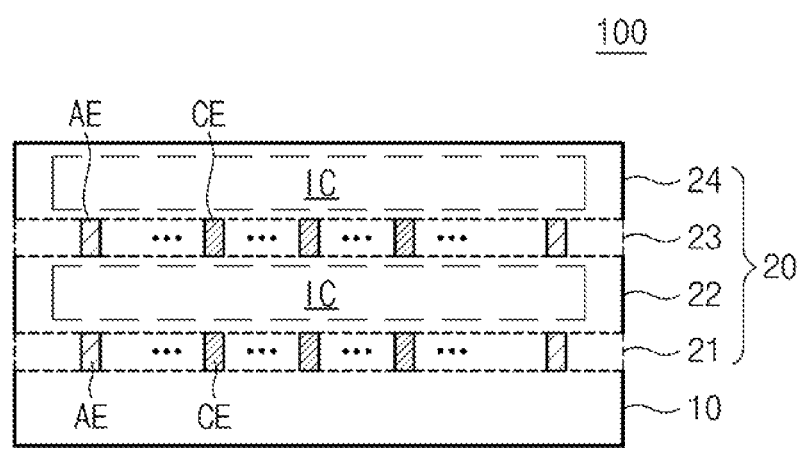
FIG. 1A is a schematic view exemplarily illustrating a semiconductor device according to embodiments of the present disclosure.

Exemplary embodiments of the present disclosure will be described below in more detail with reference to the accompanying drawings. The present disclosure may, however, be embodied in different foams and should not be construed as limited to the embodiments set forth herein. Rather, embodiments are provided so that this disclosure will be thorough and complete, and will fully convey the scope of the present disclosure to those skilled in the art. It should be noted that elements shown in the accompanying drawings may be scaled up or down for convenience in description. The dimensions of respective elements may be exaggerated or reduced.

It will also be understood that when an element is referred to as being 'on' another element, it can be directly on the other element, or intervening elements may also be present. Further, it will be understood that when an element is referred to as being 'under' another element, it can be directly under, and one or more intervening elements may also be present. In addition, it will also be understood that when an element is referred to as being 'between' two elements, it can be the only element between the two elements, or one or more intervening elements may also be present. Other terms for describing a relationship between elements, for example, "between" and "directly between" may be understood likewise.

Terms like a first and a second may be used to describe various elements, and the elements should not be limited by the terms. The terms may be used only as object for distinguishing an element from another element. For example, without departing from the spirit and scope of the present disclosure, a first element may be referred to as a second element, and similarly, the second element may be referred to as the first element.

In the following description, the technical terms are used only for explain a specific exemplary embodiment while not limiting the present disclosure. The terms of a singular form may include plural forms unless referred to the contrary. The meaning of "include," "comprise," "including," or "comprising," specifies a property, a region, a fixed number, a step, a process, an element and/or a component and does not exclude other properties, regions, fixed numbers, steps, processes, elements and/or components.

As used herein, the term "or" includes any and all combinations of one or more of the associated listed items. For example, "A or B" denotes "A, B, A and B".

Embodiments in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Embodiments of the present invention are not limited to the specific shape illustrated in the exemplary views, and may include other shapes that may be created according to manufacturing processes. For example, an etching region illustrated as a right angle may have a shape that is rounded or a certain curvature. Areas exemplified in the drawings have general properties, and are used to illustrate a specific shape of a semiconductor package region. Thus, this should not be construed as limited to the scope of the present invention.

Unless terms used in embodiments of the present disclosure are defined differently, the terms may be construed as meaning known to those skilled in the art.

Hereinafter, exemplary embodiments of the present disclosure will be described with reference to the accompanying drawings. Like reference numerals refer to like elements throughout, and an element described in the same term may have an identical or similar structure.

FIG. 1A is a schematic view exemplarily illustrating a semiconductor device according to embodiments of the present disclosure.

Referring to FIG. 1A, a semiconductor device 100 according to embodiments of the present disclosure may include a chip stack 20 mounted on a lower structure 10. The chip stack 20 may include a plurality of semiconductor chips 22 and 24, and a plurality of connection structures 21 and 23. For example, as illustrated in FIG. 2A, a chip stack may include a first connection structure 140a, a first semiconductor chip 110a, a second connection structure 140b, and a second semiconductor chip 110b that are sequentially stacked on an upper surface of a lower structure 110c.

Referring to FIG. 1A, a lower structure 10 may be a semiconductor chip, a chip stack, or a Printed Circuit Board (PCB). However, the spirit and scope of the present disclosure are not limited to disclosed embodiments of the lower structure 10. That is, the chip stack 20 may be mounted on an arbitrary element, all elements for mounting the chip stack 20 may be used as the lower structure 10 for implementing the spirit and scope of the present disclosure.

Each of the semiconductor chips 22 and 24 may be a chip including an internal circuit IC (such as an integrated circuit) and/or a microelectronic element integrated on a semiconductor substrate. For example, the internal circuit may include at least one of a Random Access Memory (RAM), a nonvolatile memory, a memory control circuit, an application processor circuit, a power supplier circuit, a modem, and a Radio Frequency (RF) circuit.

According to some embodiments of the present disclosure, the semiconductor chips 22 and 24 of the chip stack 20 may be the same kind of semiconductor chip, manufactured to have the same structure and perform the same function. For example, as in a Solid State Disk (SSD), the same kind of stacked nonvolatile memory chips may be implemented in the chip stack 20. According to other embodiments of the present disclosure, the semiconductor chips 22 and 24 implemented in the chip stack 20 may be different semiconductor chips that are manufactured to have different structures and perform different functions. For example, at least one semiconductor memory chip and at least one logic chip may be implemented in the chip stack 20. However, the spirit and scope of the present disclosure are not limited to exemplified combinations. For example, the chip stack 20 may include different kinds of elements that are selected from among semiconductor chips such as a memory chip, a logic chip and an interposer.

Each of the connection structures 21 and 23 may include connection elements CE connected to the internal circuits of the semiconductor chips 22 and 24. The connection elements CE may be used as an electric connection path between the semiconductor chips 22 and 24 or an electric connection path between the semiconductor chip 22 and the lower structure 10. Furthermore, at least one of the connection structures 21 and 23 may further include auxiliary elements AE that are attached to the semiconductor chips 22 and 24 and are not electrically connected to the internal circuit IC of the semiconductor chips 22 and 24. Technical features associated with the structure and disposition of the connection element CE and auxiliary element AE will be described below in more detail with reference to FIGS. 2A to 2D.

According to some embodiments of the present disclosure, the connection elements CE and the auxiliary element AE included in one connection structure 21 or 23 may be formed by the same process. In this case, the connection element CE and the auxiliary element AE included in the connection structure 21 or 23 may be formed of a substantially equivalent material. According to other embodiments of the present disclosure, the connection elements CE and the auxiliary elements AE in the connection structure 21 or 23 may be independently formed by different fabrication processes.

In a fabrication process, as described below with reference to FIGS. 12 to 16, a process of forming the connection structures 21 and 23 may include an operation that applies heat and/or pressure to the connection elements CE. For example, a thermo-compression operation or a reflow operation may be performed. In this case, the process of forming the connection structures 21 and 23 may be performed to satisfy a condition (hereinafter referred to as a forming condition) that may be expressed as shown in Equation (1).

$$P1<P \text{ and } T1<T \tag{1}$$

where P is a pressure applied to a connection element CE in an operation of forming a corresponding connection structure, T is a temperature applied to the connection element CE in the operation of forming the corresponding connection structure, P1 is a minimum pressure needed for forming the connection element CE, and T1 is the minimum temperature needed for forming the connection element CE.

Due to the application of heat and/or pressure, the connection structures 21 and 23 undergo at least one thermal stress or physical stress. The thermal or physical stress may cause a structural modification or change (such as the generation of an Inter-Metallic Compound (IMC)) of a completed connection element. More specifically, a pre-formed connection structures (hereinafter referred to as a previous connection structure) may undergo more thermal or physical stress than a subsequently formed connection structure (hereinafter referred to as a following connection structure), and thus, a possibility of failure in the previous connection structure may be comparatively increased.

According to an embodiment of the present disclosure, to substantially prevent such a problem in the previous connection structure, a process of forming the following connection structure may be performed to satisfy a condition (hereinafter referred to as a prevention condition) that may be expressed as shown in Equation (2).

$$P<P2 \text{ and } T<T2 \tag{2}$$

where P2 is a minimum pressure where a modification or change of a connection element included in a previous connection structure occurs in an operation of forming the following connection structure, and T2 is a minimum temperature where a modification or change of the connection element included in the previous connection structure occurs in the operation of forming the following connection structure.

Since the forming condition in Equation (1) may need to be satisfied in an operation of forming the following connection structure, the operation of forming the following connection structure may be performed to satisfy a condition that may be expressed as shown in Equation (3).

$$P1<P<P2 \text{ and } T1<T<T2 \tag{3}$$

Formation of the connection element CE may use the modification or change thereof. For example, when a solder is used as the connection element CE, the solder may be formed in a melting operation that may be understood as a modification or change operation. That is, respective differences between threshold values (i.e., P1 and T1) of a forming condition and threshold values (i.e., P2 and T2) of a prevention condition may be small. According to embodiments of the present disclosure, a process margin may be secured in the case of a small difference between the threshold values (i.e., P1 and T1) of a forming condition and threshold values (i.e., P2 and T2) of a prevention condition.

The above-described threshold values P1, P2, T1 and T2 may not be independent but correlated physical quantities. It would be apparent to those skilled in the art that the threshold values P1, P2, T1 and T2 may be dependent on a structure of a corresponding product and/or a material used for the corresponding product. By this reason, it should be understood that various embodiments described below are exemplarily. That is, embodiments of the present disclosure may be variously modified in consideration of elements (for example, a material and a structure) dependent on the above-described corresponding product. Furthermore, since those skilled in the art would understanding how to implement modifications on the basis of contents described in this application, the modifications may not be described.

Figure 1B:
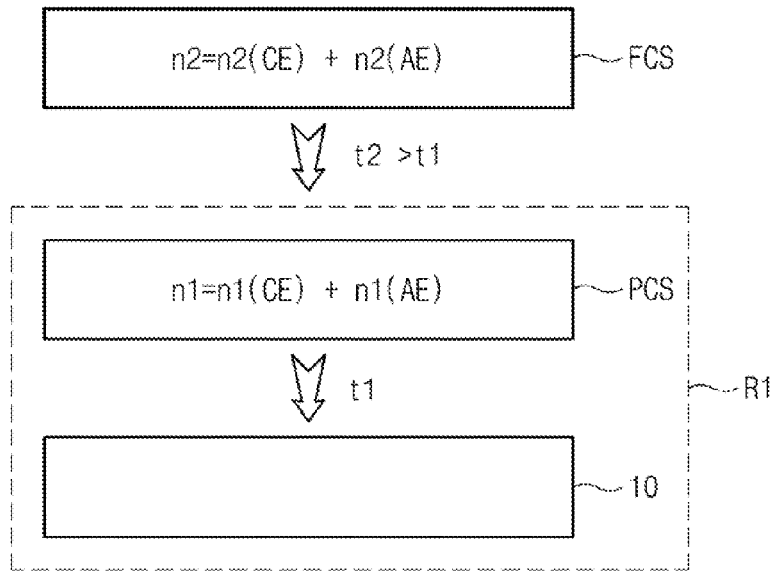
FIG. 1B is a view illustrating a method of forming connection structures according to a first mode of the present disclosure.

FIG. 1B is a view illustrating a method of forming connection structures according to an exemplary embodiment of the present disclosure.

Referring to FIG. 1B, a previous connection structure PCS may be formed on the lower structure 10, and a following connection structure FCS may be formed on a result R1. According to an exemplary embodiment, a sum (n2) of the number of the connection elements (n2(CE)) and the number of the auxiliary elements (n2(AE)) included in the following connection structure FCS may be less than a sum (n1) of the number of the connection elements (n1(CE)) and the number of the auxiliary elements (n1(AE)) included in the previous connection structure PCS. That is, n2<n1 or n2(CE)+n2(AE) <n1(CE)+n1(AE).

When a external force is applied to an upper surface of a connection structure, pressure applied to each of connection elements may be inversely proportional to the number of total elements constituting the corresponding connection structure. That is, due to the increase in the number of the connection elements CE and/or the auxiliary elements AE, the external pressure can be distributed. As described herein, when a condition "n2<n1" is satisfied, pressure applied to each of the connection elements CE of the previous connection structure PCS may be reduced as compared to a case of "n1=n2" during an operation of forming the following connection structure FCS. That is, when a condition "n2<n1" is satisfied, the prevention condition (i.e., P>P2) for the connection elements CE configuring the previous connection structure PCS is satisfied, and external pressure (i.e., n2×P) that may be applied in an operation of forming the following connection structure FCS may increase.

As exemplarily shown in Table 1 below, a condition "n1>n2" may be realized in various modes.

TABLE 1

| Applicable modes | | The same kind of chips | Different chips |
|---|---|---|---|
| Mode 1a | n1(CE) = n2(CE) and n1(AE) > n2(AE) | Possible | Possible |
| Mode 1b | n1(CE) > n2(CE) and n1(AE) = n2(AE) | Possible (limited) | Possible |
| Mode 1c | n1(CE) > n2(CE) and n1(AE) > n2(AE) | Possible (limited) | Possible |
| Mode 1d | n1(CE) < n2(CE) and n1(AE) + [n2(CE) − n1(CE)] > n2(AE) | Possible (limited) | Possible |
| Term description | | | |
| n1(CE) | Number of connection elements CE of previous connection structure | | |
| n1(AE) | Number of auxiliary elements AE of previous connection structure | | |
| n2(CE) | Number of connection elements CE of following connection structure | | |
| n2(AE) | Number of auxiliary elements AE of following connection structure | | |

As described above with reference to FIG. 1A, when the chip stack 20 is configured with the same kind of chips, the numbers of connection elements CE of the respective connection structures 21 and 23 connecting the chips may be the same. Accordingly, the mode 1a in Table 1 may be applied to a chip stack configured with the same kind of chips. Although a chip stack is a semiconductor device configured with the same kind of chips, when the previous connection structure may correspond to the connection structure 21 for connecting the lower structure 10 and the semiconductor chip 22 adjacent to the lower structure 10, all the modes in Table 1 can be applicable. According to embodiments of the present disclosure, the number of the auxiliary elements (n1(AE) or n2(AE)) may be zero.

The modes that have been described above with reference to FIG. 1B and Table 1 may be applied when the sizes of the connection elements CE and the auxiliary elements AE are the same. When the size of the connection element CE differ from the size of the auxiliary element AE, as described below with reference to FIG. 1C, embodiments of the present disclosure may be realized in other modes.

Figure 1C:
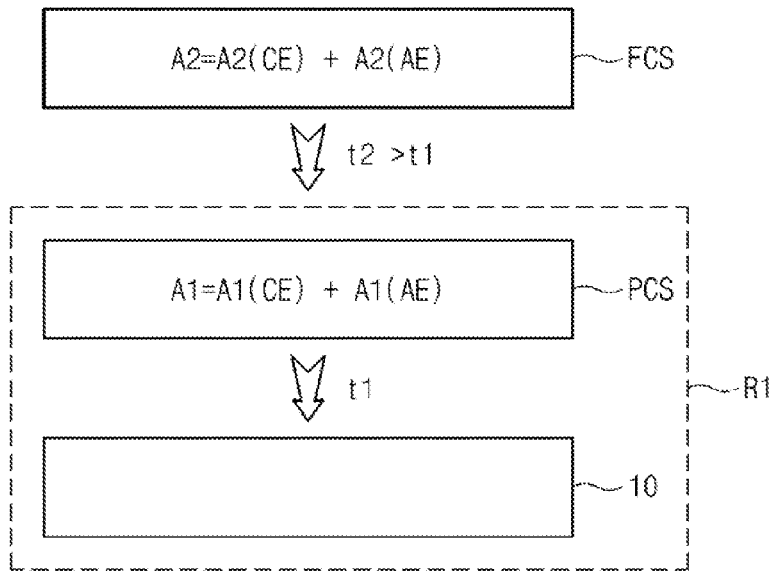
FIG. 1C is a view illustrating a method of forming connection structures according to a second mode of the present disclosure.

FIG. 1C is a view illustrating a method of forming connection structures according to an exemplary embodiment of the present disclosure.

Referring to FIG. 1C, the previous connection structure PCS may be formed on the lower structure 10, and the following connection structure FCS may be formed on the result R1. According to an exemplary embodiment of the present disclosure, the following relationship (4) may be built between the previous connection structure PCS and the following connection structure FCS.

$$A2 < A1 \text{ or } A2(CE) + A2(AE) < A1(CE) + A1(AE) \quad (4)$$

where A1(CE) is total area of the connection elements CE included in the previous connection structure PCS, A1(AE) is total area of the auxiliary elements AE included in the previous connection structure PCS, A2(CE) is total area of the connection elements CE included in the following connection structure FCS, A2(AE) is total area of the auxiliary elements AE included in the following connection structure FCS. A1 is "A1(CE)+A1(AE)", and A2 is "A2(CE)+A2(AE)". Herein, the total area A1(CE) or A2(CE) of the connection elements CE is a sum of areas of sectional surfaces of connection elements CE that intersect a flat plane parallel to the upper surface of the lower structure 10. The total area A1 (AE) or A2(AE) of the auxiliary elements AE may be defined in the same scheme.

Pressure is as an external force/area. When a certain external force is applied to an upper surface of the connection structure, pressure applied to each of connection elements CE may be inversely proportional to total area of elements CE and AE configuring the connection structure. As described herein, when a condition "A2<A1" is satisfied, pressure applied to each of the connection elements CE of the previous connection structure PCS may be reduced compared to a condition "A1=A2" during an operation of forming the following connection structure FCS. That is, when a condition "A2<A1" is satisfied, the above-described prevention condition (i.e., P<P2) for the connection elements CE configuring the previous connection structure PCS is satisfied, and external pressure (i.e., A2 X P) that may be applied in an operation of forming the following connection structure FCS may increase.

As exemplarily shown in Table 2 below, a condition "A1>A2" may be realized in various modes.

TABLE 2

| Applicable modes | | The same kind of chips | Different chips |
|---|---|---|---|
| Mode 1 | A1(CE) = A2(CE) and A1(AE) > A2(AE) | Possible | Possible |
| Mode 2 | A1(CE) > A2(CE) and A1(AE) = A2(AE) | Possible (limited) | Possible |
| Mode 3 | A1(CE) > A2(CE) and A1(AE) > A2(AE) | Possible (limited) | Possible |
| Mode 4 | A1(CE) < A2(CE) and A1(AE) + [A2(CE) − A1(CE)] > A2(AE) | Possible (limited) | Possible |
| Term description | | | |
| A1(CE) | Total area of connection elements CE of previous connection structure | | |
| A1(AE) | Total area of auxiliary elements AE of previous connection structure | | |
| A2(CE) | Total area of connection elements CE of following connection structure | | |
| A2(AE) | Total area of auxiliary elements AE of following connection structure | | |

According to modified embodiments of the present disclosure, the previous connection structure PCS and the following connection structure FCS may be formed of materials different from each other, respectively. For example, the previous connection structure PCS may be formed of a material having a melting point higher than that of the following connection structure FCS. In the modified embodiments of the present disclosure, the mode 1 or the mode 2 may be modified in consideration of the prevention condition of Equation (2). Such modification can be implemented by those skilled in the art, based on exemplary embodiments of the present disclosure described herein.

Figure 2B:
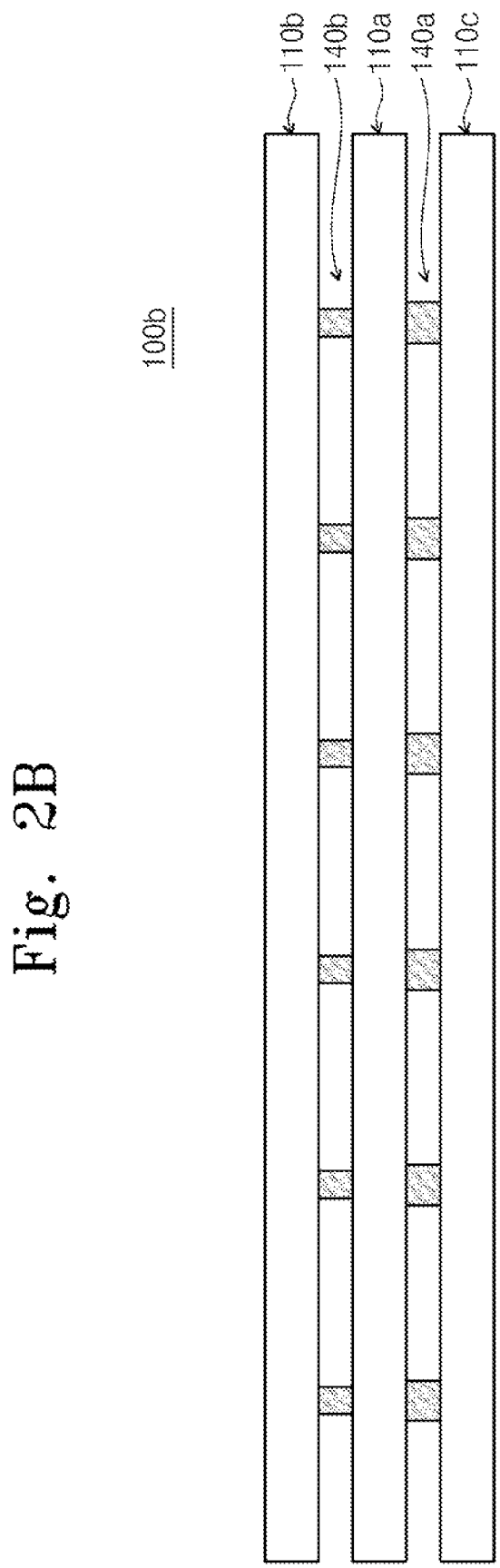
Figure 2D:
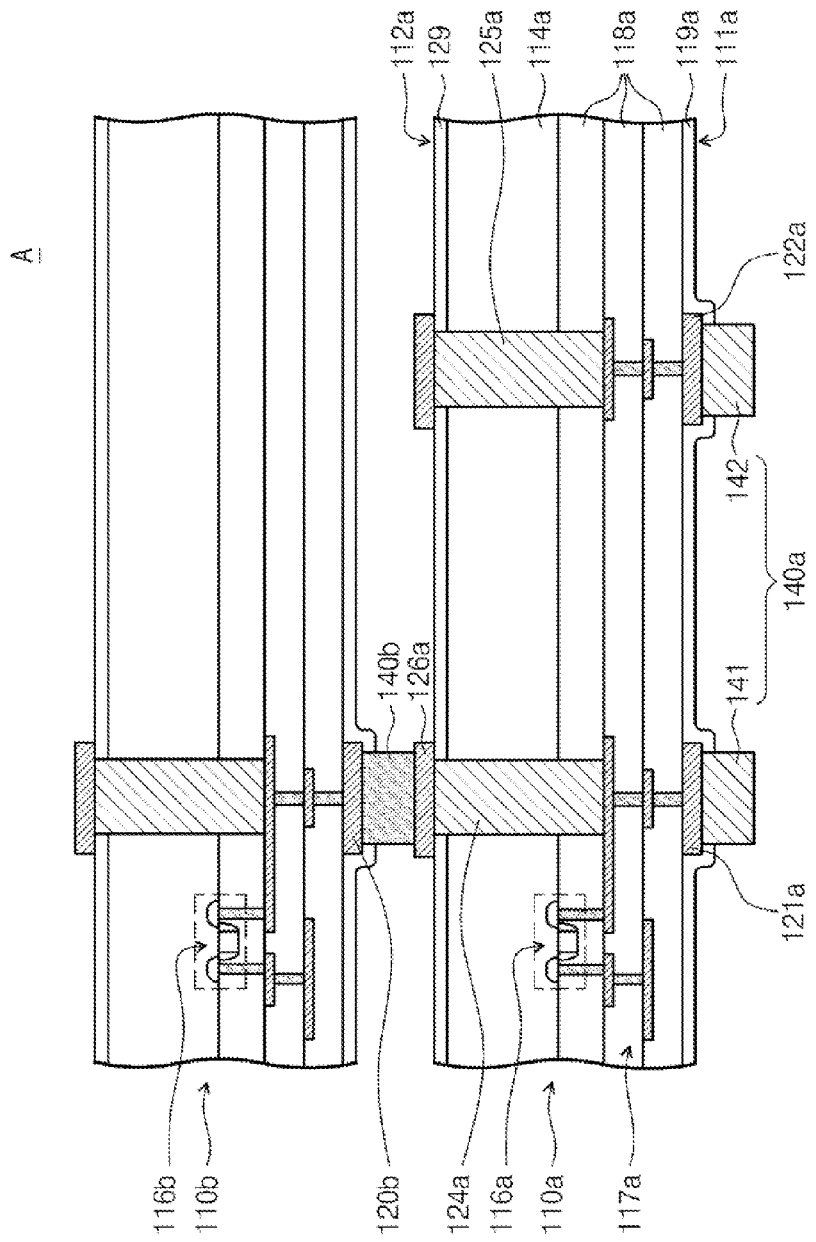

FIGS. 2A and 2B are sectional views illustrating a semiconductor device according to some embodiments of the present disclosure. FIGS. 2C and 2D are enlarged views of a portion A in FIG. 2A.

Referring to FIG. 2A, a semiconductor device 100a may include a chip stack mounted on a lower structure 110c. The chip stack may include a first connection structure 140a, a first semiconductor chip 110a, a second connection structure 140b, and a second semiconductor chip 110b that are sequentially stacked on an upper surface of a lower structure 110c.

A portion of technical features associated with the semiconductor chips will be described below with reference to FIG. 2C. The first semiconductor chip 110a is exemplarily described below. Those skilled in the art will recognize that the second semiconductor chip 110b may include technical features substantially similar to the first semiconductor chip 110a. Referring to FIG. 2C, the first semiconductor chip 110a may include a semiconductor substrate 114a, an internal circuit 116a integrated on one surface of the semiconductor substrate 114a, an internal wiring 117a connected to the internal circuit 116a, and a chip pad 120a (see FIG. 2A, wherein the chip pad 120 may include first and second chip pads 121a and 122a shown in FIG. 2C) connected to the internal wiring 117a. The internal circuit 116a may be electrically connected to an external electronic device through the internal wiring 117a and the chip pad 120a.

The semiconductor substrate 114a may include a lower surface (or an active surface) in which the internal circuit 116a is integrated, and an upper surface (or a back side) opposite to the lower surface. The upper surface and/or the lower surface of the semiconductor substrate 114a may have a non-uniform height. For example, where the internal circuit 116a is integrated, non-uniformity in the lower surface of the semiconductor substrate 114a may be intended. A trench for isolation may be an example of intended non-uniformity. Non-uniformity in the upper surface of the semiconductor substrate 114a may be a result of a back-side grinding process, as an unintended technical feature. Furthermore, the lower surface of the semiconductor substrate 114a may have an intended non-uniformity of an impurity concentration, resulting from a process of forming the internal circuit 116a. Based on such differences, the upper surface and lower surface of the semiconductor substrate 114a may be distinguished. As shown in FIGS. 2A and 2C, the first semiconductor chip 110a has first and second surfaces 111a and 112a. The first and second surfaces 111a and 112a may be adjacent to the lower surface and upper surface of the semiconductor substrate 114a, respectively.

The semiconductor chip 110a may further include a passivation layer 119a and/or an interlayer dielectric 118a. The passivation layer 119a, as illustrated in FIG. 2C, may expose a chip pad 121a and be disposed on a lower surface of the semiconductor substrate 110a. The interlayer dielectric 118a may be disposed between the passivation layer 119a and the semiconductor substrate 114a, and include a plurality of insulation layers that structurally support and electrically insulate the internal wirings 117a. According to some embodiments of the present disclosure, as illustrated in FIG. 2C, the first semiconductor chip 110a may further include a back-side insulation layer 129 covering an upper surface of the semiconductor substrate 114a. According to other embodiments of the present disclosure, the first semiconductor chip 110a may be formed to expose the upper surface of the semiconductor substrate 114a without the back-side insulation layer 129.

According to some embodiments of the present disclosure, the first semiconductor chip 110a may further include a via pad 126a disposed on the second surface 112a of the first semiconductor chip 110a and for connecting to another semiconductor chip (for example, the second semiconductor chip 110b). Furthermore, the first semiconductor chip 110a may further include a first through via 124a electrically connected to the chip pad 120a and the via pad 126a (see FIG. 2A).

The first through via 124a may be formed to have a long axis substantially vertical to the second surface 112a and pass through at least one portion of the first semiconductor chip 110a. For example, as illustrated in FIG. 2C, the first through via 124a may be formed to have a via middle structure passing through the semiconductor substrate 114a and a portion of the interlayer dielectric 118a, between the internal wiring 117a and the via pad 126a. According to other embodiments of the present disclosure, the first through via 124a may have a through silicon via structure passing through the semiconductor substrate 114a. In this case, the first through via 124a may be used as an electric path connecting the chip pad 120a and the via pad 126a through the first semiconductor chip 110a. The structure of the first through via 124a is not limited to the exemplified structures, and may be variously modified. For example, the first through via 124a may have a via first structure that does not pass through the interlayer dielectric 118a or a via last structure that directly contacts the chip pad 120a through the interlayer dielectric 118a.

Referring again to FIG. 2A, the first connection structure 140a may be disposed on a first surface 111a and connected to the chip pad 120a. The second connection structure 140b may be disposed on a second surface 112a and connected to the via pad 126a. The second semiconductor chip 110b may be electrically connected to the internal circuit 116a of the first semiconductor chip 110a through the first through via 124a and the second connection structure 140b. The first semiconductor chip 110a may be electrically connected to the lower structure 110c through the first connection structure 140a. According to some embodiments of the present disclosure, the first connection structure 140a, the chip pad 120a, the first through via 124a, the via pad 126a and the second connection structure 140b may be aligned to be disposed in a line that perpendicularly passes through the first surface 111a. However, the embodiments of the present disclosure are not limited thereto.

The first and second connection structures 140a and 140b may differ in area ratio. Herein, the area ratio may be a ratio occupied by the contact area of a connection structure and a lower structure or a semiconductor chip, with respect to an area of one surface of a semiconductor chip or a lower structure contacting a connection structure. For example, when the second connection structure 140b is formed later in time than the first connection structure 140a, the second connection structure 140b may have an area ratio less than that of the first connection structure 140a.

Since an area ratio of a connection structure is inversely proportional to a bonding force for bonding of the connection structure, a bonding force needed for bonding of the second connection structure 140b may be less than a bonding force needed for bonding of the first connection structure 140a. For example, a bonding process for the connection structure may be performed in a thermo-compression process or a reflow process. In this case, a bonding force may be applied to the connection structure as heat or pressure. The first connection structure 140a may receive heat or pressure twice in an operation of stacking the first and second semiconductor chips 110a and 110b. Due to this, the first connection structure 140a is modified or additional Inter-Metallic Compound (IMC) is generated, and thus a contact failure between the first semiconductor chip 110a and the lower structure 110c may occur. According to an exemplary embodiment, by making the bonding force of the second connection structure 140b less than a threshold value of a force that causes the modification of the pre-formed first connection structure 140a, a probability of a contact failure due to modification of the first connection structure 140a can be reduced.

Area ratios of the first and second connection structures 140a and 140b may be different from each other by various schemes. For example, when the first and second connection structures 140a and 140b are formed in an equal or similar size, the area ratios may be made different by making the numbers of first and second connection structures 140a and 140b different from each other. As another example, the area ratios may be made different by making sizes of the first and second connection structures 140a and 140b different.

FIG. 2A illustrates an example where the number of first connection structures 140a differs from the number of second connection structures 140b. For example, when the first semiconductor chip 110a and the lower structure 110c are connected through the first connection structure 140a and the second semiconductor chip 110b and the first semiconductor chip 110a are connected through the second connection structure 140b, the number of second connection structures 140b may be less than the number of first connection structures 140a. Accordingly, a bonding force for bonding of the second connection structure 140b may be determined in a range that does not cause the modification of the first connection structure 140a.

The number of second connection structures 140b may be determined in a range where a bonding process may be performed by bonding force that does not cause the modification of the first connection structure 140a. As the number of second connection structures 140b decreases, a bonding force for bonding of the second connection structure 140b may be reduced, and thus the modification of the first connection structure 140a may be abated. For example, the number of second connection structures 140b may be about 50% to 90% of the number of first connection structures 140a.

The first connection structure 140a may include a connection element 141 and an auxiliary element 142. The connection element 141 and the auxiliary element 142 may be substantially similar in structure, and differ in electric connection. The connection element 141 and the auxiliary element 142 may be disposed with first and second chip pads 121a and 122a, respectively. The first and second chip pads 121a and 122a may be formed having a substantially similar structure, and differ in connection relationship with the internal circuit 116a (see FIG. 2C). For example, the first chip pad 121a may be connected to the internal circuit 116a or the first through via 124a, and the second chip pad 122a may be electrically insulated from the internal circuit 116a or the first through via 124a. That is, the connection element 141 may be electrically connected to the first semiconductor chip 110a, and the auxiliary element 142 may be electrically insulated from the first semiconductor chip 110a. That is, the auxiliary element 142 may be a dummy connection structure. As another example, the connection element 141 may deliver a signal, and the auxiliary element 142 may deliver a power source voltage. In this case, although not shown, the second chip pad 122a may be electrically connected to the internal circuit 116a through the internal wiring 117a. The connection element 141 may be aligned and disposed in a vertical direction with the second connection structure 140b, and the number of connection elements 141 may be the same as the number of second connection structures 140b. Although not shown, the second connection structure 140b may include a connection element and an auxiliary element. The connection element and auxiliary element of the second connection structure 140b may be substantially similar to the connection element 141 and auxiliary element 142 of the first connection structure 140a, respectively.

FIG. 2B illustrates an example where the size of each of the first connection structures 140a differs from that of the second connection structures 140b. The size of a connection structure represents an area where the connection structure contacts a semiconductor chip, or the sectional area of the connection structure. For example, when the first semiconductor chip 110a and the lower structure 110c may be connected through the first connection structures 140a and the second semiconductor chip 110b and the first semiconductor chip 110a are connected through the second connection structures 140b, the size of each of the second connection structures 140b may be less than that of the first connection structures 140a. In this case, the number of first connection structures 140a may the same as the number of second connection structures 140b, and the first connection structure 140a may not include the auxiliary element 142.

Each of the first and second connection structures 140a and 140b may include a conductive bump, a conductive spacer, a solder ball, a micro solder bump, etc. For example, as illustrated in FIG. 2C, the second connection structure 140b may include a first conductive means 151 and a second conductive means 152. The first conductive means 151, including portions 151a and 151b, may be attached to the chip pad 120b and the via pad 126a, and the second conductive means 152 may be disposed between the portions 151a and 151b of the first conductive means 151. Although not shown, the first through via 124a may protrude from a second surface 112a of the first semiconductor chip 110a, and the via pad 126a may not be formed. In this case, the first conductive means 151 attached to the via pad 126a may not be formed, and the first conductive means 151 may be attached to the first through via 124a.

The second conductive means 152 may include a metal material having a melting point lower than that of the first conductive means 151. For example, the first conductive means 151 may be an Under Barrier Metal (UBM) including copper (Cu), and the second conductive means 152 may be a solder of stannum or Tin (Sn), SnAg, SnPb, SnBi, SnAgCu and the like. A shape of the second conductive means 152 may be variously modified in an operation of bonding the second connection structure 140b. The first connection structure 140a may be formed in a structure substantially similar to that of the second connection structure 140b.

Referring to FIG. 2D, a second through via 125a passing through at least one portion of the first semiconductor chip 110a may be formed. The second through via 125a may be electrically insulated from the first through via 124a, and deliver a power source voltage or a ground voltage. The auxiliary element 142 may be electrically connected to the second through via 125a, and deliver the power source voltage or the ground voltage.

FIG. 3A is a sectional view illustrating a semiconductor device according to an exemplary embodiment of the present disclosure. A semiconductor device 200 of FIG. 3A includes a lower structure 210c, first and second semiconductor chips 210a and 210b stacked on the lower structure 210c, a first connection structure 240a disposed between the lower structure 210c and the first semiconductor chip 210a, and a second connection structure 240b disposed between the first and second semiconductor chips 210a and 210b. The lower structure 210c, the first and second semiconductor chips 210a and 210b, the first connection structure 240a, and the second connection structure 240b may correspond to the lower structure 110c, first and second semiconductor chips 110a and 110b, first connection structure 140a, and second connection structure 140b of the semiconductor device 100a in FIG. 2A, respectively. Hereinafter, for conciseness, technical features that are not repetitive of FIG. 2A will be described.

Referring to FIG. 3A, the first semiconductor chip 210a or the second semiconductor chip 210b may include a rewiring 260. For example, when the first and second semiconductor chips 210a and 210b are different first and second semiconductor chips, the first connection structure 240a and the second connection structure 240b may not be vertically aligned. For example, as illustrated in FIG. 3A, the rewiring 260 may be connected to a through via 224a at one surface of the first semiconductor chip 210a facing the second semiconductor chip 210b, and the second connection structure 240b and the first semiconductor chip 210a may be connected through the rewiring 260. In this case, a connection element 241 and the second connection structure 240b may not be vertically aligned. As another example, although not shown, the rewiring 260 may be formed at one surface of the second semiconductor chip 210b facing the first semiconductor chip 210a, and the second connection structure 240b may be connected to the second semiconductor chip 210b through the rewiring 260. In this case, the connection element 241 and the second connection structure 240b may not be vertically aligned.

FIG. 3B is a sectional view illustrating a semiconductor device according to an exemplary embodiment of the present disclosure. Here, a semiconductor device includes a lower structure, and a plurality of semiconductor chip floors stacked on the lower structure. Each of the semiconductor chip floors may include a semiconductor chip, and a connection structure disposed at one surface of the semiconductor chip. Hereinafter, an exemplary embodiment including three layers of semiconductor chip floors is described. The present disclosure is not limited thereto and the number of semiconductor chip floors may include two or more layers.

Referring to FIG. 3B, a semiconductor device 300 may include first to third semiconductor chip floors 300a to 300c stacked on the lower structure 310d. The stacked order of the first to third semiconductor chip floors 300a to 300c is not limited to the order described herein. Hereinafter, a case where the first to third semiconductor chip floors 300a to 300c are stacked in order is described as an example. The third semiconductor chip floor 300c may be the uppermost semiconductor chip floor among a plurality of stacked semiconductor chip floors, and may be disposed farthest from the lower structure 310d. A lower semiconductor chip floor is closer to the lower structure 310d than an upper semiconductor chip floor.

The first semiconductor chip floor 300a may include a first connection structure 340a and a first semiconductor chip 310a disposed at one side of the first connection structure 340a. For example, the first semiconductor chip 310a may be disposed where a first surface 311a thereof faces the lower structure 310d, and is connected to the lower structure 310d through a first connection structure 340a disposed between the lower structure 310d and the first semiconductor chip 310a. The first connection structure 340a may include a first connection element 341a and a first auxiliary element(s) 342a. For example, the first connection element 341a may be electrically connected to the first semiconductor chip 310a, and the first auxiliary element 342a may be electrically insulated from the first semiconductor chip 310a. That is, the first auxiliary element(s) 342a may be a dummy connection structure that is not electrically connected to a through via or an internal circuit of the first semiconductor chip 310a.

The second semiconductor chip floor 300b may be disposed on the first semiconductor chip floor 300a. The second semiconductor chip floor 300b may include a second semiconductor chip 310b and a second connection structure 340b disposed at one side of the second semiconductor chip 310b. The second connection structure 340b may be disposed between the first semiconductor chip 310a and the second semiconductor chip 310b, and the second semiconductor chip 310b may be connected to the first semiconductor chip 310a through the second connection structure 340b. The second connection structure 340b may include a second connection element 341b electrically connected to the second connection structure 340b, and a second auxiliary element 342b electrically insulated from the second semiconductor chip 310b. That is, the second auxiliary element 342b may be a dummy connection structure that is not electrically connected to a through via or an internal circuit of the second semiconductor chip 310b. For example, the second connection element 341b and the second auxiliary element 342b may have a structure substantially similar to that of the first connection element 341a and that of the second auxiliary element 342a, respectively. In FIG. 3B, an example where the second connection element 341b is vertically aligned with the first connection element 341a is illustrated. Embodiments of the present disclosure are not limited thereto. As illustrated in FIG. 3A, the second connection element 341b may be connected through a rewiring.

A third semiconductor chip floor 300c may be disposed on the second semiconductor chip floor 300b. The third semiconductor chip floor 300c may include a third semiconductor chip 310c and a third connection structure 340c disposed at one side of the third semiconductor chip 310c. The third connection structure 340c may be disposed between the second and third semiconductor chips 310b and 310c, and connect the second and third semiconductor chips 310b and 310c. When the third semiconductor chip floor 300c is an uppermost semiconductor chip floor, the third connection structure 340c may not include an auxiliary element. In this case, as illustrated in FIG. 3B, the third connection structure 340c may be disposed to be vertically aligned with the second connection element 341b and the first connection element 341a. Alternatively, although not shown, the third connection structure 340c may include an auxiliary element, which may be a dummy connection structure.

An area ratio may increase or decrease progressively closer to a lower semiconductor chip floor. For example, the size or number of a connection structure may increase or decrease progressively closer to a lower semiconductor chip floor. For example, when the first to third semiconductor chip floors 300a to 300c are sequentially stacked on the lower structure 310d, as a semiconductor chip floor is disposed farther from the lower structure 310d, the number of connection structures may decrease. As illustrated in FIG. 3B, the number of first connection structures 340a may be greater than the number of second connection structures 340b, and the number of second connection structures 340b may be greater than the number of third connection structures 340c.

The number of auxiliary elements may increase progressively closer to a lower semiconductor chip floor. For example, the number of first connection elements 341a may be equal to the number of second connection elements 341b, and the number of first auxiliary elements 342a may be greater than the number of second auxiliary elements 342b. When the third connection structure 340c includes an auxiliary element, the number of auxiliary elements in the third connection structure 340c may be less than the number of second auxiliary elements 342b.

According to an exemplary embodiment, the number of connection structures decreases progressively closer to an upper semiconductor chip floor, and thus a bonding force may be reduced in an operation of bonding the connection structure of the upper semiconductor chip floor. A probability of contact error due to the modification of a connection structure of a lower semiconductor chip floor may be reduced.

When a semiconductor device includes four or more semiconductor chip floors, a structure according to FIGS. 3A-B may be applied to some semiconductor chip floors. That is, the semiconductor device may include a semiconductor chip floor where an area ratio of a connection structure is substantially similar. Alternatively, an area ratio of a connection structure may increase and then decrease, or decrease and then increase progressively closer to an upper or lower semiconductor chip floor.

Figure 4:
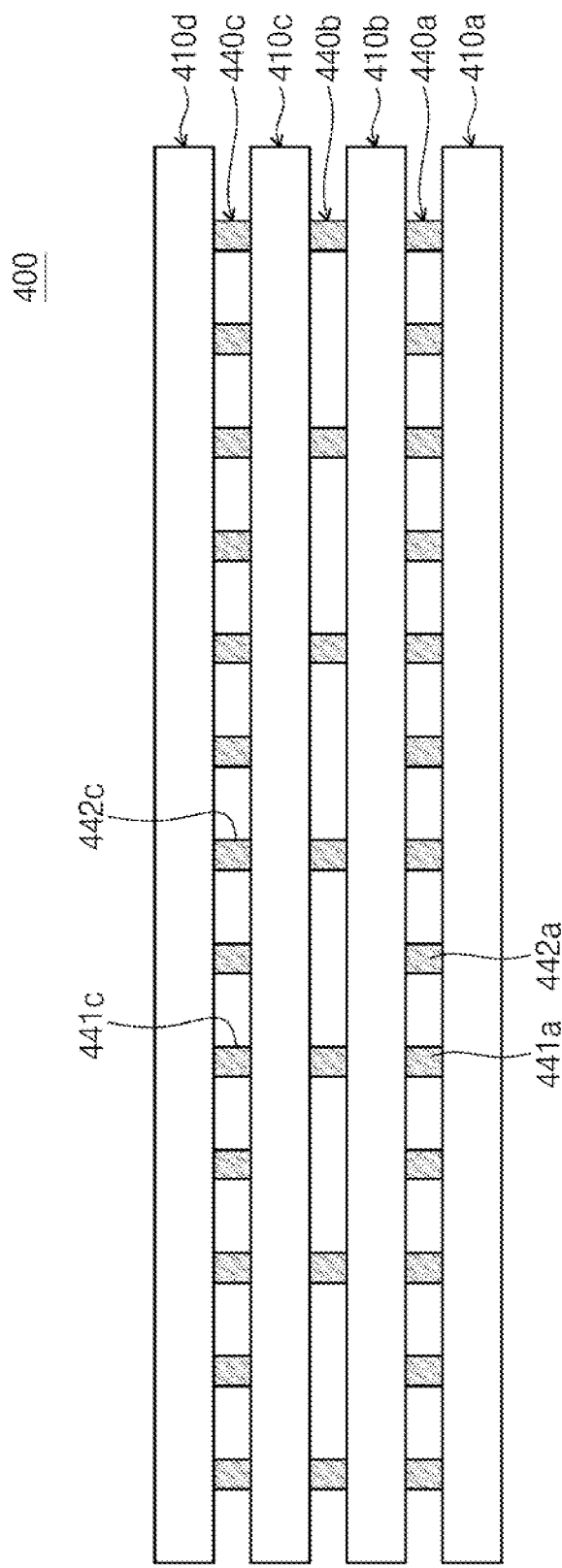
FIG. 4 is a sectional view illustrating a semiconductor device according to another embodiment of the present disclosure.

FIG. 4 is a sectional view illustrating a semiconductor device according to an exemplary embodiment of the present disclosure.

Referring to FIG. 4, a semiconductor device 400 may include a plurality of stacked semiconductor chips and a connection structure disposed between the semiconductor chips. For example, the semiconductor device 400 may include stacked sequentially first to fourth semiconductor chips 410a to 410d, a first connection structure 440a disposed between the first and second semiconductor chips 410a and 410b, a second connection structure 440b disposed between the second and third semiconductor chips 410b and 410c, and a third connection structure 440c disposed between the third and fourth semiconductor chips 410c and 410d.

The area ratio of the second connection structure 440b may be less than that of the first or third connection structure 440a or 440c. For example, the number of second connection structures 440b may be less than the number of first or third connection structures 440a or 440c. For example, the first connection structure 440a may include a first connection element 441a and a first auxiliary element 442a, and the third connection structure 440c may include a third connection element 441c and a third auxiliary element 442c. The first and third connection elements 441a and 441c may be electrically connected to a semiconductor chip, and each of the first and third auxiliary elements 442a and 442c may be dummy connection structures electrically insulated from the semiconductor chip. The second connection structure 440b may not include a dummy connection structure. In this case, the number of second connection structures 440b may be the same as the number of first or third connection elements 441a or 441c. Although not shown, the second connection structure 440b may include a dummy connection structure. In this case, the number of dummy connection structures of the second connection structure 440b may be less than the number of first or third auxiliary elements 442a or 442c.

Figure 5A:
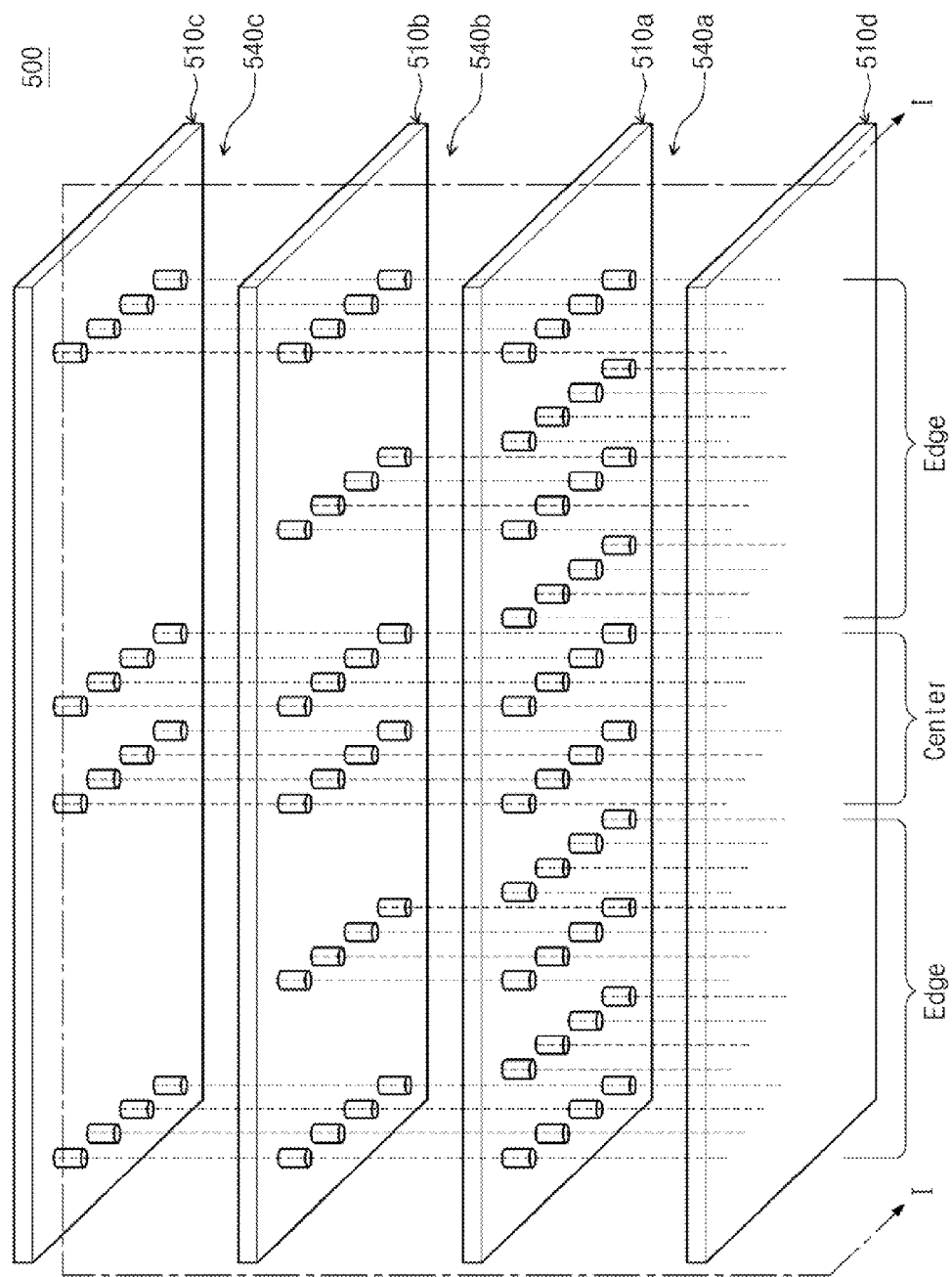
FIG. 5A is a perspective view exemplarily illustrating one side surface of a semiconductor device according to an embodiment of the present disclosure.
Figure 5B:
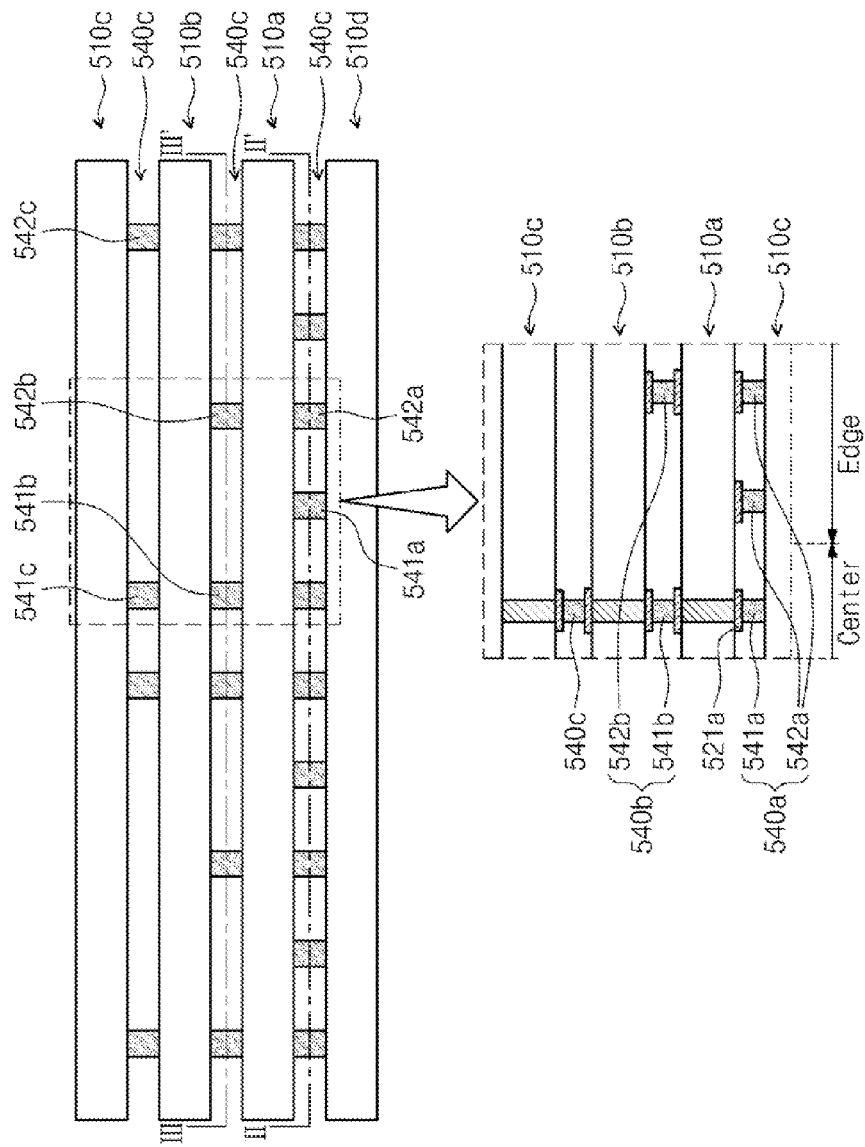
FIG. 5B is a sectional view of the semiconductor device shown along dot line I-I of FIG. 5A.
Figure 6A:
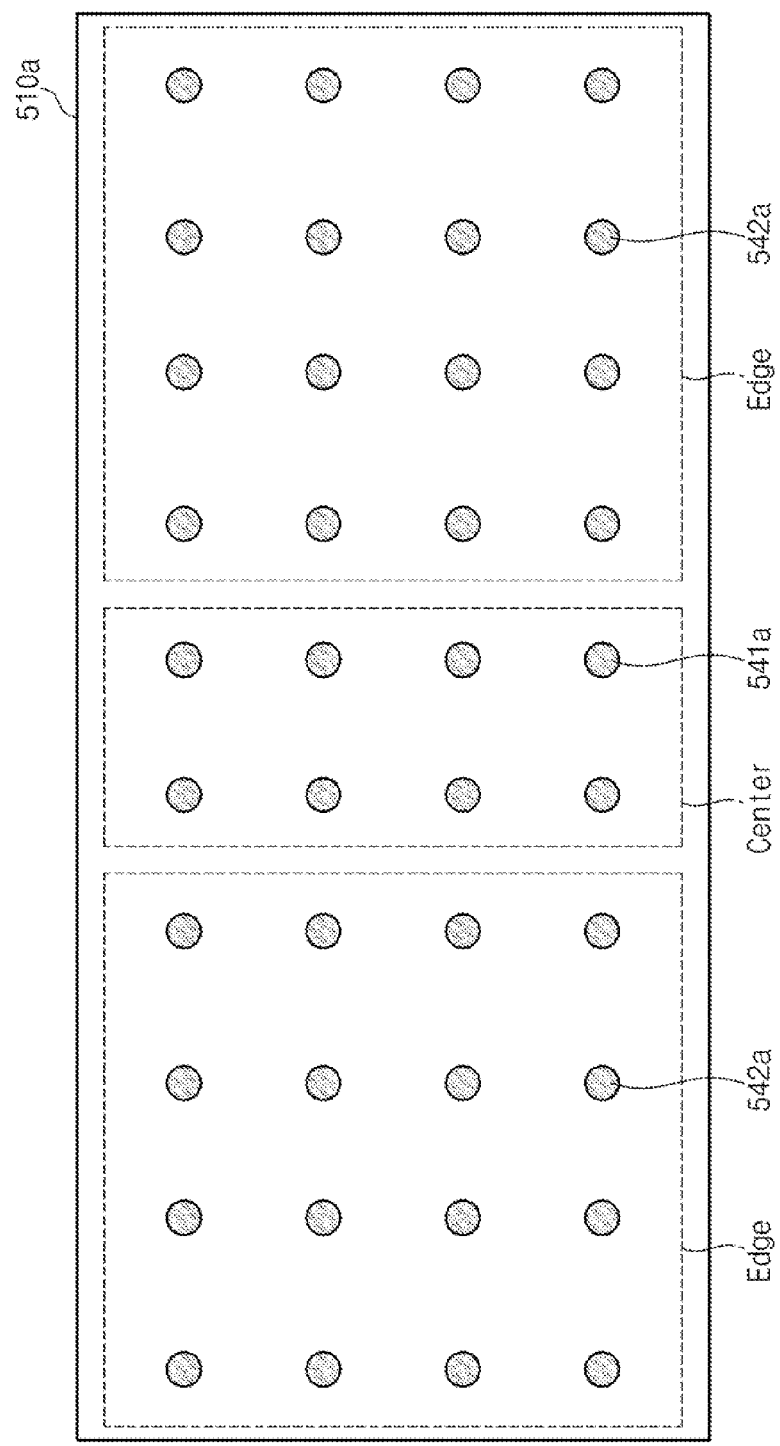
FIGS. 6A and 6B are plan views of the semiconductor device shown along dot lines II-II' of FIG. 5B FIGS. 7A and 7B are plan views of the semiconductor device shown along dot lines III-III' of FIG. 5B.
Figure 6B:
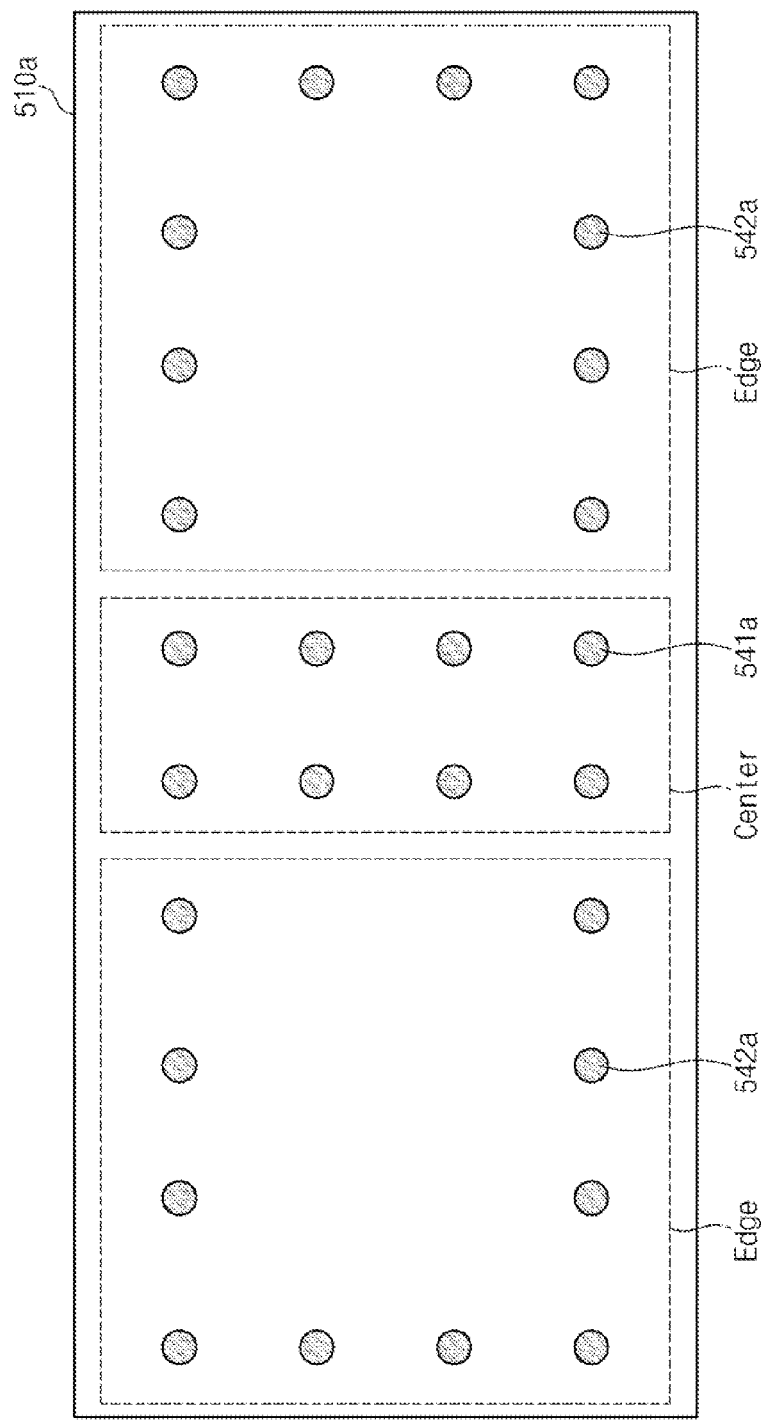

FIG. 5A is a perspective view exemplarily illustrating one side surface of a semiconductor device according to an embodiment of the present disclosure. FIG. 5B is a sectional view of the semiconductor device shown along dot line I-I of FIG. 5A. FIGS. 6A and 6B are plan views of the semiconductor device shown along dot line II-II' of FIG. 5B. FIGS. 7A and 7B are plan views of the semiconductor device shown along dot line III-III' of FIG. 5B.

A semiconductor device according to an exemplary embodiment includes a lower structure 510d, first to third semiconductor chips 510a to 510c disposed on the lower structure 510d, and first to third connection structures 540a to 540c disposed on the lower structure 510d. The lower structure 510d, the disposition of the first to third semiconductor chips 510a to 510c and the structures of the first to third connection structures 540a to 540c may be substantially similar to the lower structure 310d, the disposition of the first to third semiconductor chips 310a to 310c and the structures of the first to third connection structures 340a to 340c in the semiconductor device described above with reference to FIG. 3B, respectively. Hereinafter, for conciseness, technical features that are not repetitive of FIG. 3B will be described.

Referring to FIGS. 5A to 7B, the first connection structure 540a may include a first connection element 541a and a first auxiliary element 542a. The first connection element 541a may be disposed at a center portion of the first semiconductor chip 510a, and the first auxiliary element 542a may be disposed at an edge portion of the first semiconductor chip 510a. For example, the first semiconductor chip 510a may be a Dynamic RAM (DRAM) having a center pad disposition, and the center pad may be disposed at the center portion of the first semiconductor chip 510a.

As illustrated in FIG. 5B, the center pad may include a first chip pad 521a electrically connected to a through via or an internal circuit of the first semiconductor chip 510a. The second connection structure 540b may include a second connection element 541b and a second auxiliary element 542b. The third connection structure 540c may include a third connection element 541c and a third auxiliary element 542c. The second connection element 541b may be disposed at the center portion of the second semiconductor chip 510b, and the third connection element 541c may be disposed at the center portion of the third semiconductor chip 510c. The second auxiliary element 542b may be disposed at an edge portion of the second semiconductor chip 510b, and the third auxiliary element 542c may be disposed at an edge portion of the third semiconductor chip 510c. For example, the second or third connection element 541b or 541c may be disposed to be vertically aligned with the first connection element 541a, and the number of second or third connection elements 541b or 541c may be the same as the number of first connection elements 541a. The numbers of second and third auxiliary elements 542b and 542c may be less than the number of first auxiliary elements 542a. For example, the number of second auxiliary elements 542b may be less than the number of first auxiliary elements 542a, and the number of third auxiliary elements 542c may be less than the number of second auxiliary elements 542b. The second and third connection elements 541b and 541c may be electrically connected to the second and third semiconductor chips 510b and 510c, respectively. The second and third auxiliary elements 542b and 542c may be electrically insulated from the second and third semiconductor chips 510b and 510c, respectively.

The disposition of the first to third connection structures 540a to 540c may be variously modified in a range where a pre-formed connection structure is not modified by a bonding force given in a subsequent bonding operation of a connection structure.

For example, as illustrated in FIG. 6A, the first auxiliary element 542a may be disposed having a similar arrangement as that of the first connection element 541a, or as illustrated in FIG. 6B, the first auxiliary element 542a may be disposed along an edge portion of the first semiconductor chip 510a. Referring to FIGS. 7A and 7B, the second auxiliary element 542b may be disposed to vertically overlap with at least one portion of a first auxiliary element 542a.

Figure 8:
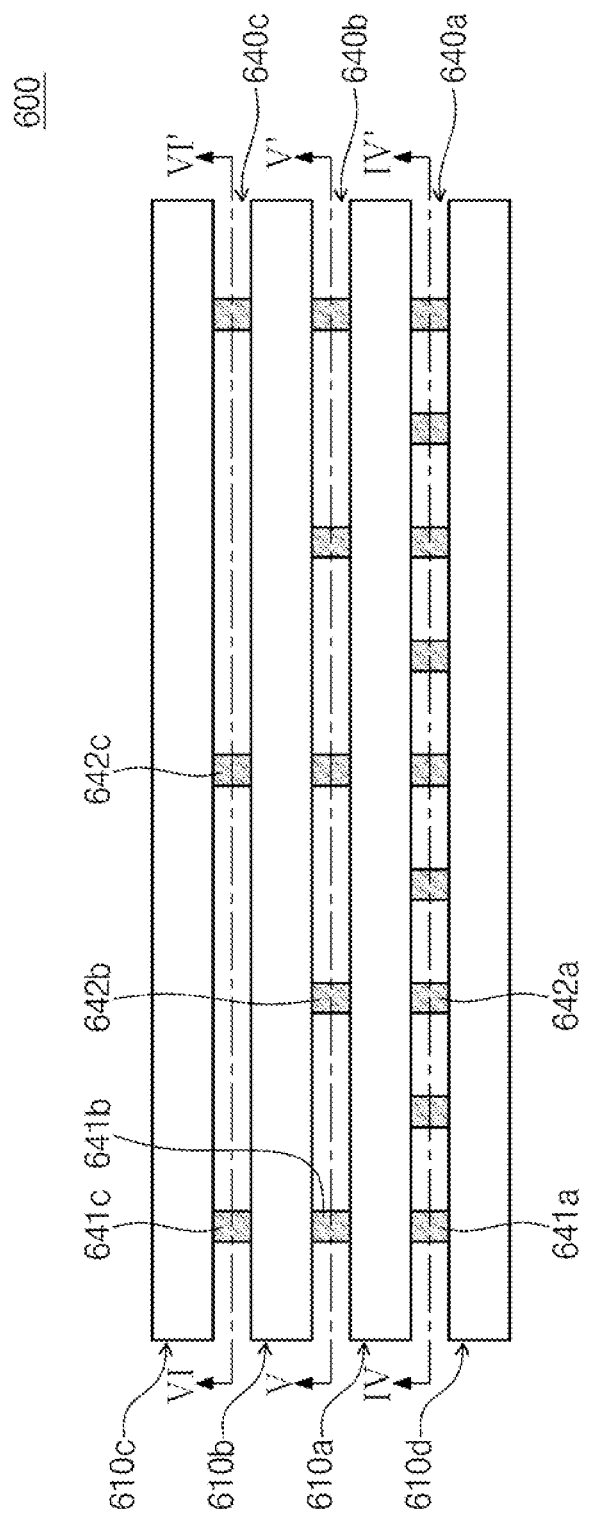
FIG. 8 is a sectional view illustrating a semiconductor device according to still another embodiment of the present disclosure.
Figure 9B:
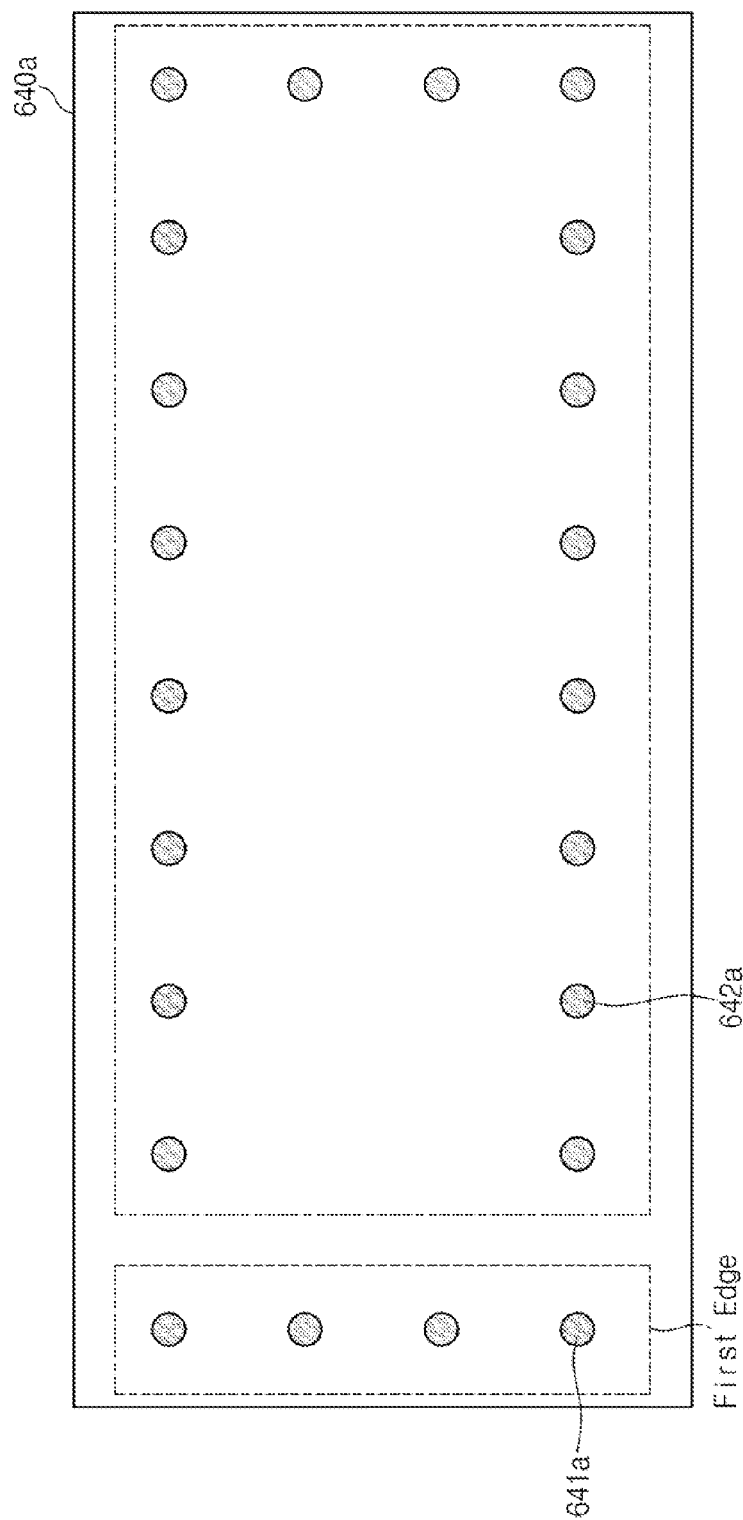
Figure 10:
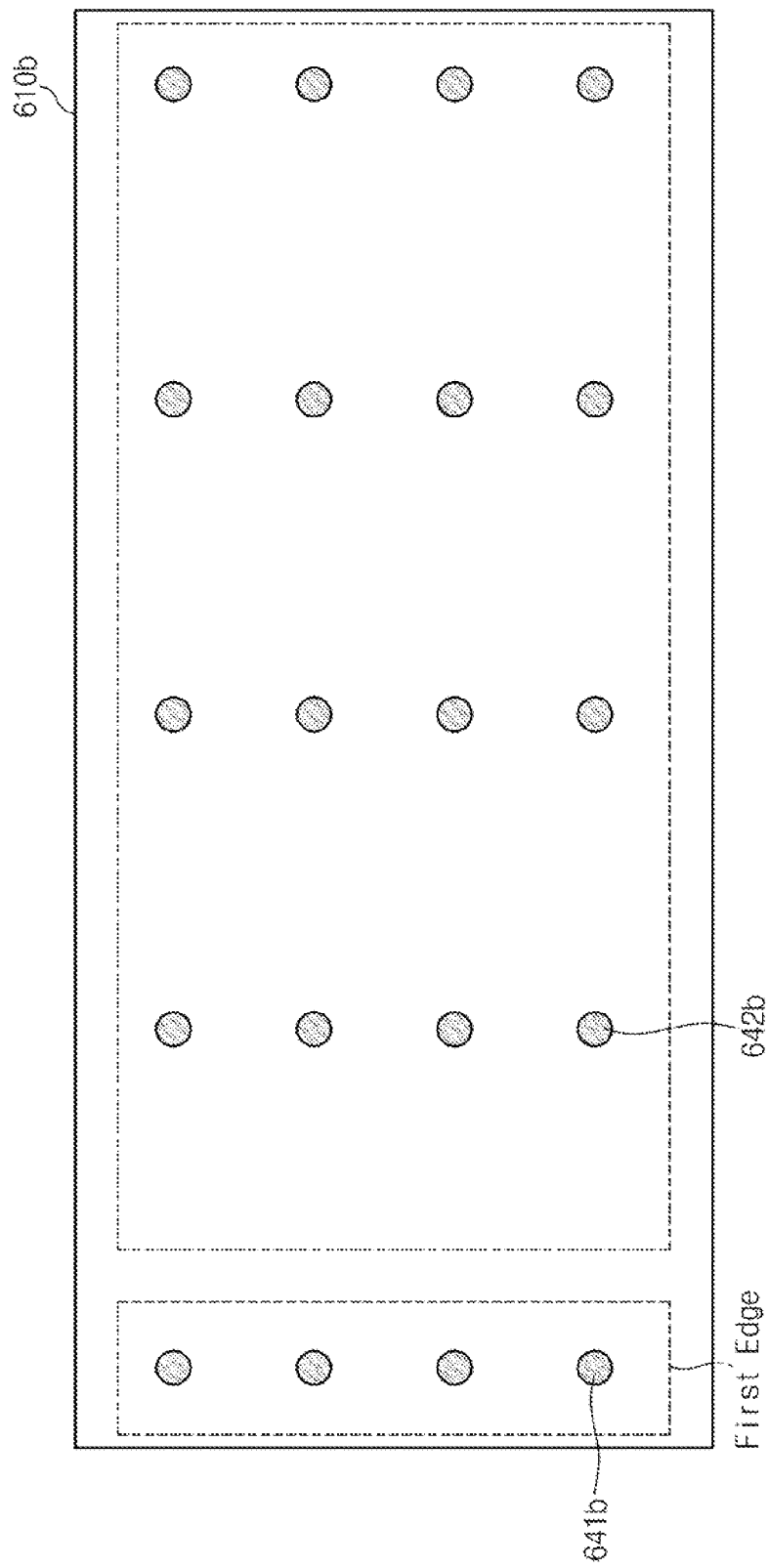

FIG. 8 is a sectional view illustrating a semiconductor device according to an exemplary embodiment of the present disclosure. FIGS. 9A and 9B are plan views exemplarily illustrating various structures of a connection structure shown along dot line IV-IV' of FIG. 8. FIGS. 10 and 11 are plan views exemplarily illustrating the connection structure shown along dot lines V-V' and V-V' of FIG. 8, respectively.

A semiconductor device 600 of FIG. 8 may include a lower structure 610d, first, second and third semiconductor chips 610a, 610b and 610c, and first, second and third connection structures 640a, 640b and 640c disposed on the lower structure 610d. The lower structure 610d, the disposition of the first to third semiconductor chips 610a to 610c and the structures of the first to third connection structures 640a to 640c may be substantially similar to the lower structure 310d, the disposition of the first to third semiconductor chips 310a to 310c and the first to third connection structures 340a to 340c in the semiconductor device 300 of FIG. 3B, respectively. Hereinafter, for conciseness, technical features that are not repetitive of FIG. 3B will be described.

Referring to FIGS. 8 to 9B, the first connection structure 640a may include a first connection element 641a and a first auxiliary element 642a. The first connection element 641a may be disposed at a first edge portion of the first semiconductor chip 610a, and the first auxiliary element 642a may be disposed in a region other than the first edge portion of the first semiconductor chip 610a. For example, the first semiconductor chip 610a may be a flash memory chip having an edge pad disposition, and the first edge portion may be a region where the edge pad is disposed.

Referring to FIGS. 8 and 10, the second connection structure 640b may include a second connection element 641b and a second auxiliary element 642b. The second connection element 641b may be disposed at a first edge portion of the second semiconductor chip 610b, and the second auxiliary element 642b may be disposed in a region other than the first edge portion of the second semiconductor chip 610b. The second auxiliary element 642b may be vertically aligned with a portion of the first auxiliary element 642a.

Referring to FIGS. 8 and 11, the third connection structure 640c may include a third connection element 641c and a third auxiliary element 642c. The third connection element 641c may be disposed at a first edge portion of the third semiconductor chip 610c, and the third auxiliary element 642c may be disposed in a region other than the first edge of the third semiconductor chip 610c. The third auxiliary element 642c may be vertically aligned with a portion of the first or second auxiliary element 642a or 642b.

The disposition of the first to third connection structures 640a to 640c is not limited to the above-described embodiments and may be variously modified.

Figure 12A:
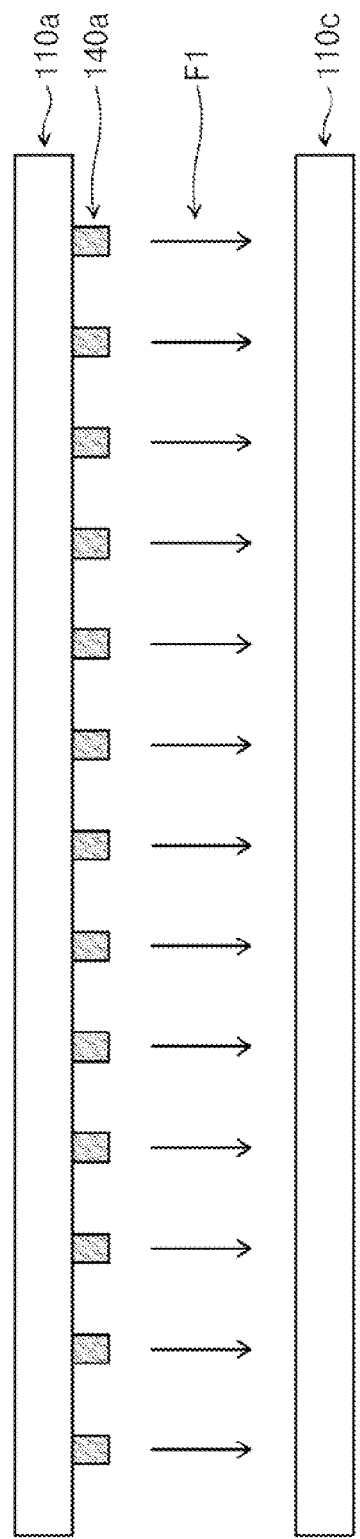
Figure 12C:
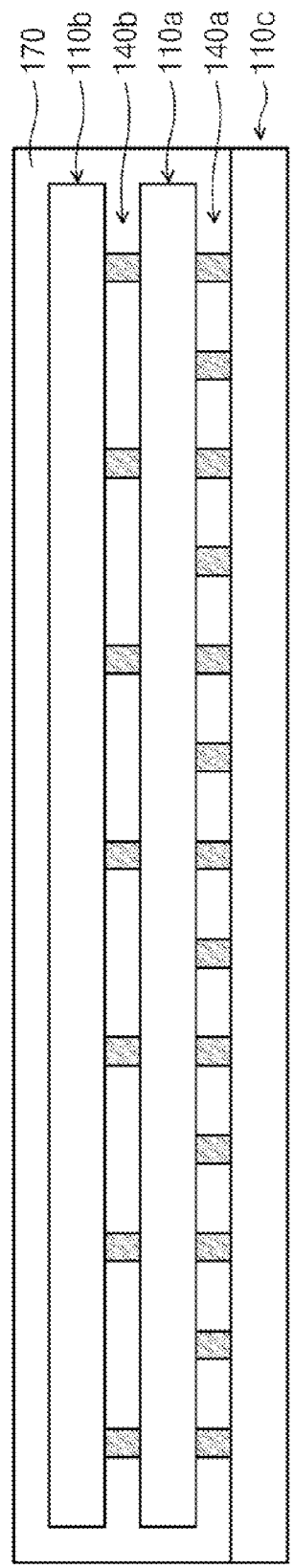

FIGS. 12A to 12C are sectional views illustrating a method of fabricating a semiconductor device, according to an embodiment of the present disclosure. Hereinafter, for conciseness, an exemplary method of forming a semiconductor device will be described in terms of the semiconductor device 100a of FIG. 2A.

A method of fabricating a semiconductor device according to an embodiment of the present disclosure may include providing the lower structure 110c, bonding the first semiconductor chip 110a to the lower structure 110c by a first bonding force F1, and bonding the second semiconductor chip 110b to the first semiconductor chip 110a by a second bonding force F2. The second bonding force F2 may be less than the first bonding force F1. For example, when each bonding process is performed in thermo-compression, the first force F1 may be a first pressure, and the second force F2 may be a second pressure. Referring to FIG. 12A, the first semiconductor chip 110a may be mounted on one surface of the lower structure 110c. The lower structure 110c may be another semiconductor substrate, a film, a substrate having a circuit pattern, etc. Hereinafter, however, a case where the lower structure 110c is the substrate will be described as an example.

The lower structure 110c and the first semiconductor chip 110a may be connected by the first connection structure 140a. The first connection structure 140a may be disposed between the lower structure 110c and the first semiconductor chip 110a, and by applying the first bonding force F1, the lower structure 110c and the first semiconductor chip 110a may be connected. In FIG. 12A, it is illustrated that the first connection structure 140a is attached to the first semiconductor chip 110a for bonding to the lower structure 110c; the present disclosure is not limited thereto. For example, the first connection structure 140a may be attached to the lower structure 110c and provided for bonding to the first semiconductor chip 110a. Alternatively, the lower structure 110c and the first semiconductor chip 110a may be attached to the first conductive means 151a and 151b (see FIG. 2C), respectively, and the second conductive means 152 may be attached to at least one of the first conductive means 151a and 151b and provided for bonding to the remaining first conductive means 151a or 151b.

As an area ratio occupied by the first connection structure 140a increases, the first bonding force F1 may also increase. That is, when connection structures have an equal or similar size, as the number of first connection structures 140a increases, the first bonding force F1 may be increased. For example, when a bonding process is performed at the same temperature, a pressure of nF may be applied for bonding an number of connection structures n on the assumption of that a threshold pressure needed for bonding one connection structure is F. As illustrated in FIG. 12A, when the number of first connection structures 140a is thirteen, a force of 13F may be applied for bonding the first semiconductor chip 110a to the lower structure 110c with the first connection structure 140a.

Referring to FIG. 12B, the second semiconductor chip 110b may be stacked on the first semiconductor chip 110a. The second connection structure 140b may be disposed between the first and second semiconductor chips 110a and 110b, and by applying the second bonding force F2, the first and second semiconductor chips 110a and 110b may be connected. In FIG. 12B, it is illustrated that the second connection structure 140b is attached to the second semiconductor chip 110b and provided for bonding to the first semiconductor chip 110a; the present disclosure is not limited thereto. The second connection structure 140b may be provided in various types, as described with reference to the first connection structure 140a.

The second bonding force F2 may be less than the first bonding force F1. For example, as illustrated in FIG. 12B, when the sizes of the first and second connection structures 140a and 140b are substantially similar, the number of second connection structures 140b may be less than the number of first connection structures 140a. When the number of second connection structures 140b is seven, a force of 7F may be applied for connecting the first and second semiconductor chips 110a and 110b by the second connection structure 140b. The force of 7F is less than 13F applied for bonding of the first connection structure 140a, and is not sufficient to substantially modify the first connection structure 140a. The first connection structure 140a may not be modified in an operation of bonding the second connection structure 140b. A difference between the first force F1 and the second force F2 is not limited to the above-described embodiment, and may be determined in a range where the first connection structure 140a is not modified.

Referring to FIG. 12C, a molding part 170 covering at least one portion of the lower structure 110c, first semiconductor chip 110a or second semiconductor chip 110b may be formed. The molding part 170 protects the first and second connection structures 140a and 140b against an external condition, thereby preventing the first and second connection structures 140a and 140b from being modified. For example, the molding part 170 may include an Epoxy Molding Compound (EMC).

Figure 13B:
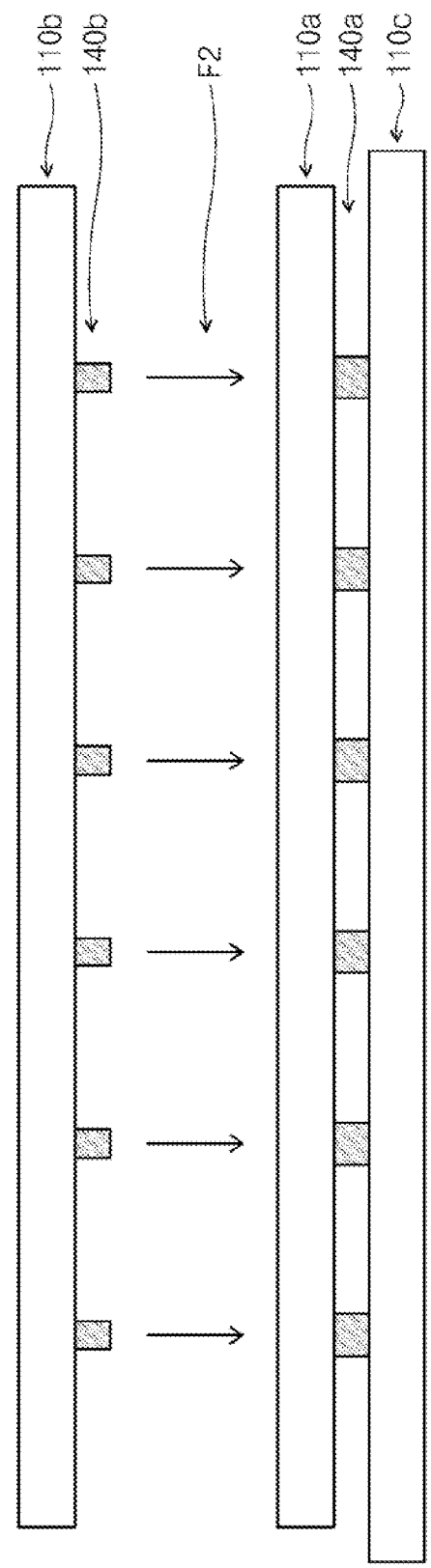

FIGS. 13A and 13B are sectional views illustrating a method of fabricating a semiconductor device, according to an exemplary embodiment of the present disclosure. Hereinafter, for conciseness, an exemplary method of forming the semiconductor device will be described in terms of the semiconductor device 100b of FIG. 2B, and technical features that are not repetitive of FIGS. 12A and 12B will be described.

Referring to FIGS. 13A and 13B, the first connection structure 140a may be greater than the second connection structure 140b in sectional area or volume. Herein, the sectional area may be the sectional area of the first or second connection structure 140a or 140b that intersects a flat plane parallel to the upper surface of the lower structure 110c.

According to exemplary embodiments of the present disclosure, even when the number of first connection structures 140a is the same as the number of second connection structures 140b, each of the second connection structures 140b may have an area ratio or sectional area less than each of the first connection structures 140a. For example, when the first and second semiconductor chips 110a and 110b are of the same kind and the first connection structure 140a has a sectional area greater by two times than the second connection structure 140b, the area ratio of the second connection structure 140b may be half of the area ratio of the first connection structure 140a. A bonding process of the second connection structure 140b may be performed by second bonding force F2 less than the first bonding force F1. As a result, the modification of the first connection structure 140a can be substantially prevented.

Figure 14A:
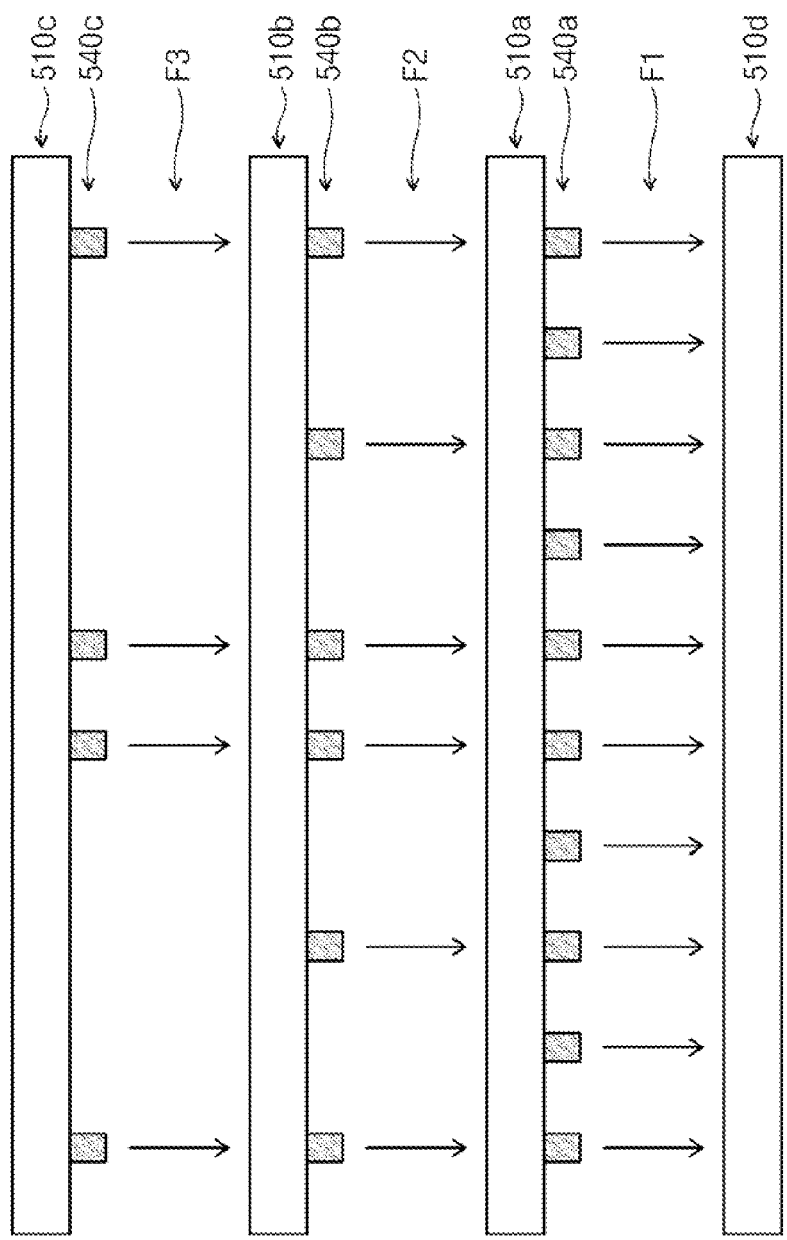
FIGS. 14A to 14C are sectional views illustrating a method of fabricating a semiconductor device, according to still another embodiment of the present disclosure.
Figure 14B:
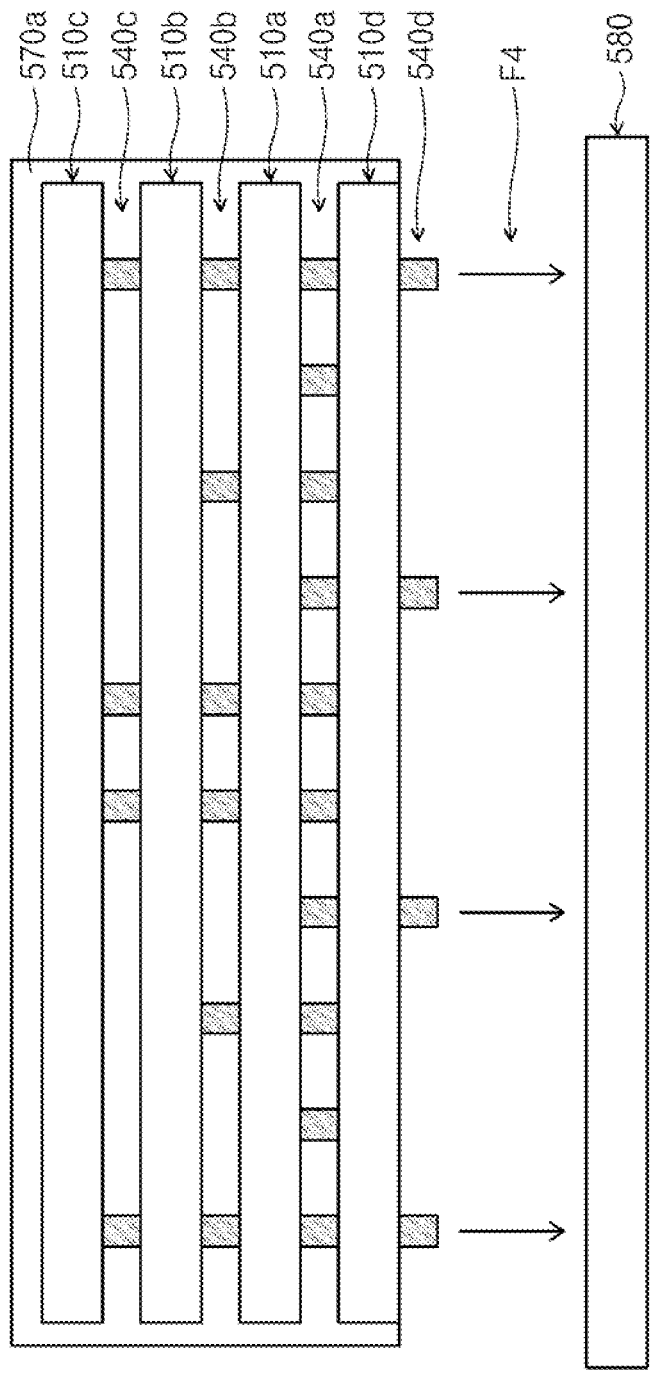
Figure 14C:
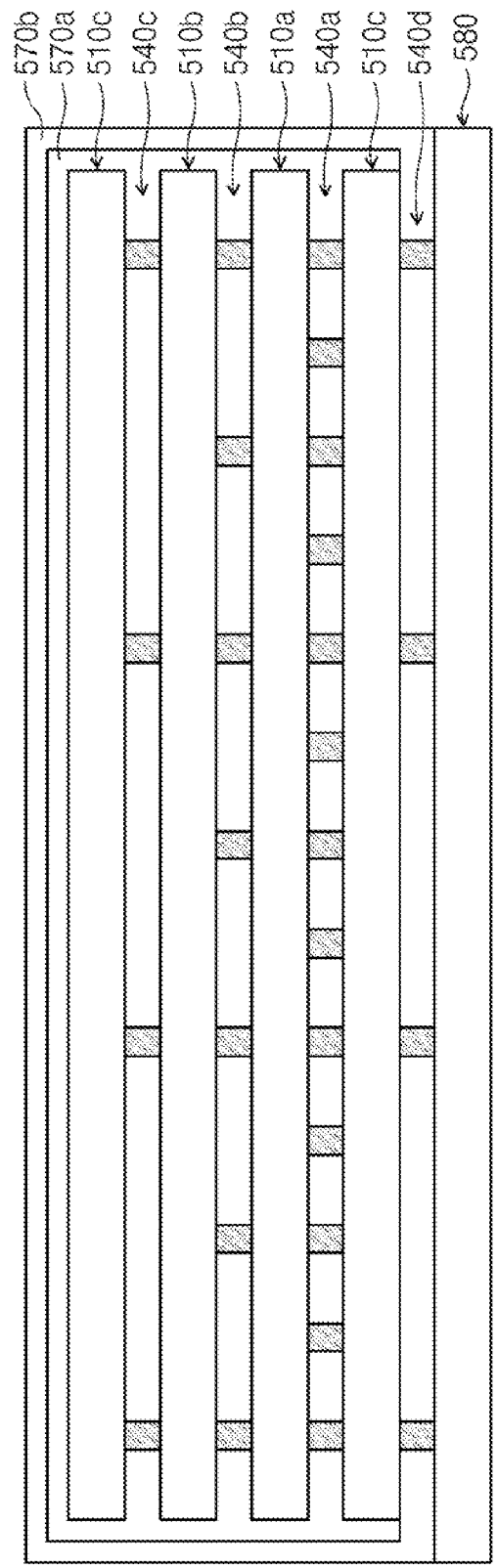

FIGS. 14A to 14C are views illustrating a method of fabricating a semiconductor device, according to an exemplary embodiment of the present disclosure.

A method of fabricating a semiconductor device according to an exemplary embodiment of the present disclosure includes forming a chip stack including a plurality of semiconductor chips, &Inning a first molding part covering at least one portion of the chip stack, mounting the chip stack on a substrate, and forming a second molding part covering at least one portion of the chip stack and the substrate. Hereinafter, for convenience, a method of fabricating the semiconductor device of FIG. 5A will be described as an example.

Referring to FIG. 14A, a chip stack may be formed by stacking a plurality of semiconductor chips. The semiconductor chips may be connected to each other through a bonding process of a connection structure disposed therebetween. For example, when a lower structure 510d is a fourth semiconductor chip 510d, the chip stack may include first to fourth semiconductor chips 510a to 510d, a first connection structure 540a disposed between the fourth semiconductor chip 510d and the first semiconductor chip 510a, a second connection structure 540b disposed between the first semiconductor chip 510a and the second semiconductor chip 510b, and a third connection structure 540c disposed between the second semiconductor chip 510b and the third semiconductor chip 510c. When the first to third semiconductor chips 510a to 510c are sequentially stacked on the fourth semiconductor chip 510d, a bonding force applied to a connection structure for connecting a semiconductor chip may be reduced progressively over each subsequent process. That is, the second bonding force F2 for connecting the second semiconductor chip 510b to the first semiconductor chip 510a may be less than the first bonding force F1 for connecting the first semiconductor chip 510a to the fourth semiconductor chip 510d. Moreover, the third bonding force F3 for connecting the third semiconductor chip 510c to the second semiconductor chip 510b may be less than the second bonding force F2. Accordingly, due to a bonding force applied in a subsequent bonding process, the modification of a pre-formed connection structure can be decreased or prevented.

Referring to FIG. 14B, a molding part 570a covering at least one portion of a chip stack may be formed, and the chip stack may be mounted on a substrate 580. The first molding part 570a may be disposed between respective semiconductor chips to cover a connection structure, or cover a region other than a region of the substrate 580 for mounting. For example, the first molding part 570a may include an underfill material or an EMC. When the first molding part 570a is formed before being mounted on the substrate 580, heat or pressure applied in a substrate mounting operation is absorbed by the first molding part 570a, and thus modification in the first to third connection structures 540a to 540c can be substantially prevented. To mount the chip stack on the substrate 580, a fourth bonding force F4 may be determined irrespective of the first to third bonding forces F1 to F3. For example, the fourth bonding force F4 may be equal to or greater than any one of the first to third bonding forces F1 to F3. That is, when respective connection structures have the same size, the number of fourth connection structures 540d may be equal to or greater than that of any one of the first to third connection structures 540a to 540c. Even when the fourth bonding force F4 is greater than the first, second or third bonding force F1, F2 or F3, the first to third connection structures 540a to 540c are protected by the first molding part 570a and thus may not be modified in an operation of mounting the chip stack on the substrate 580.

Referring to FIG. 14C, a second molding part 570b covering at least one portion of the chip stack and the substrate 580 may be formed. The second molding part 570b may be disposed between the chip stack and the substrate 580 and protect the fourth connection structure 540d. Alternatively, as illustrated in FIG. 14C, the second molding part 570b may be formed to cover the first molding part 570a and the substrate 580.

Figure 15:
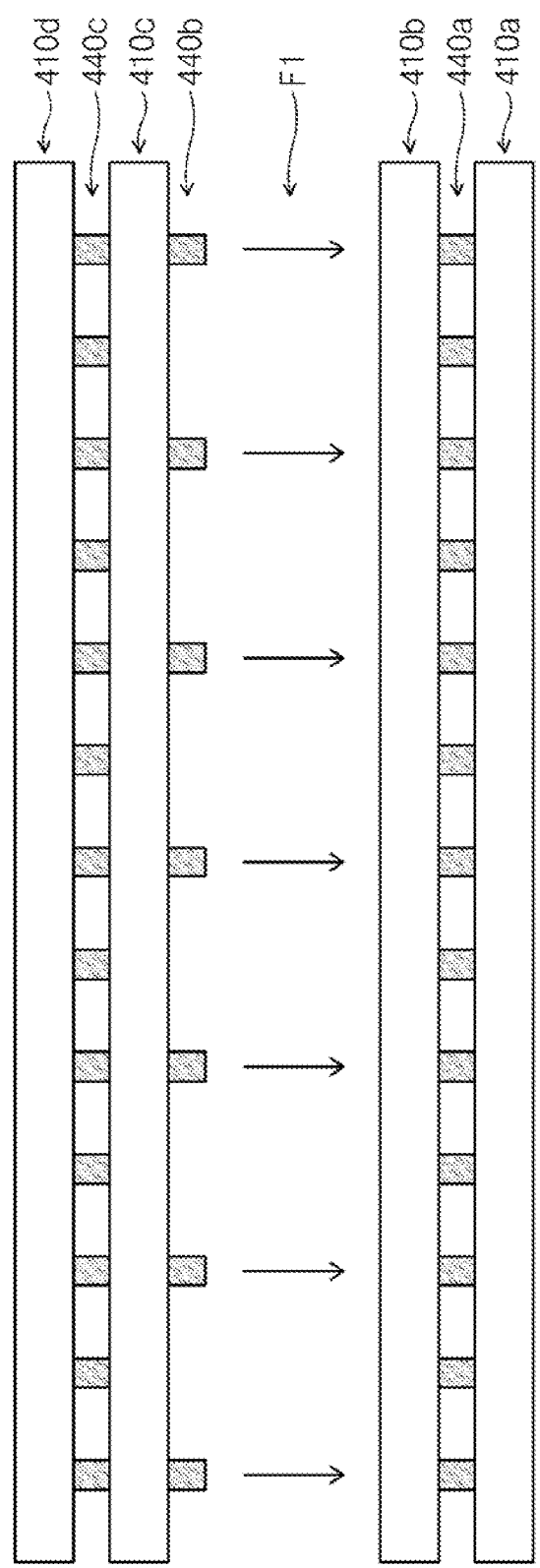
FIG. 15 is a sectional view illustrating a method of fabricating a semiconductor device according to a modified embodiment of the present disclosure.

FIG. 15 is a view illustrating a method of fabricating a semiconductor device according to an exemplary embodiment of the present disclosure. Here, first and second chip stacks including a plurality of chips may be formed, and thereafter, a semiconductor device may be formed by connecting the first and second chip stacks. A fabrication method may be implemented as described with reference to the exemplary method of fabricating the semiconductor device of FIG. 4.

Referring to FIG. 15, by connecting first and second semiconductor chips 410a and 410b with a first connection structure 440a, a first chip stack may be formed, and, by connecting third and fourth semiconductor chips 410c and 410d with a third connection structure 440c, a second chip stack may be formed. Subsequently, the first and second chip stacks may be connected with the second connection structure 440b. In this case, a bonding force F1 for bonding of the second connection structure 440b may be less than a bonding force applied in the bonding processes of the first or third connection structures 440a and 440c. The bonding force F1 applied in a bonding process of the second connection structure 440b is not sufficient to substantially modify the first or third connection structure 440a or 440c.

Figure 16A:
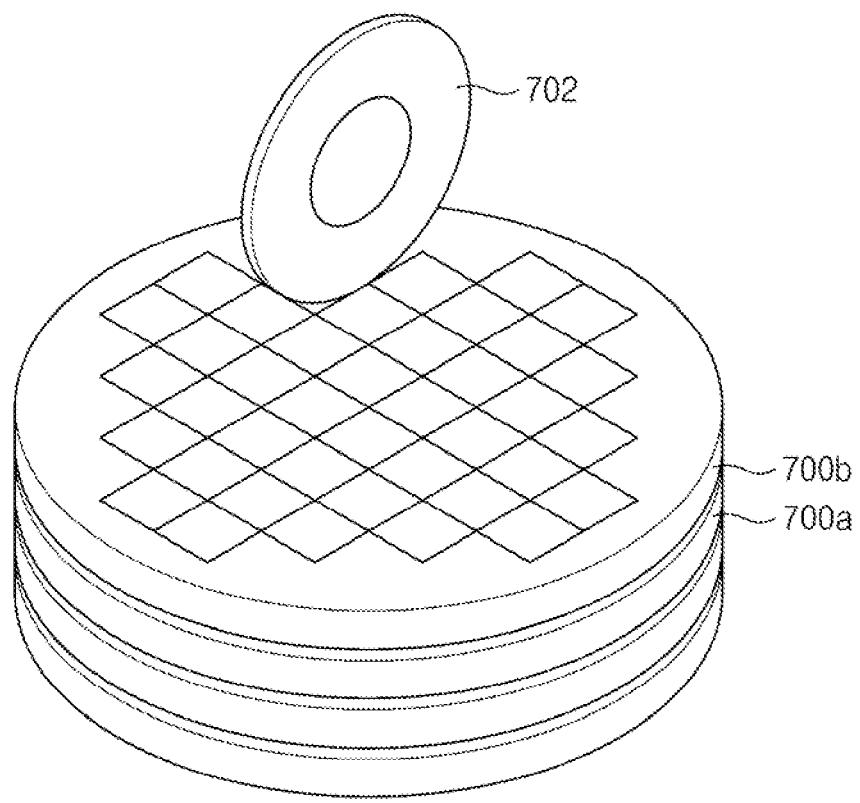
FIGS. 16A to 16C are views exemplarily illustrating fabrication methods according to some embodiments of the present disclosure forming a chip stack.
Figure 16B:
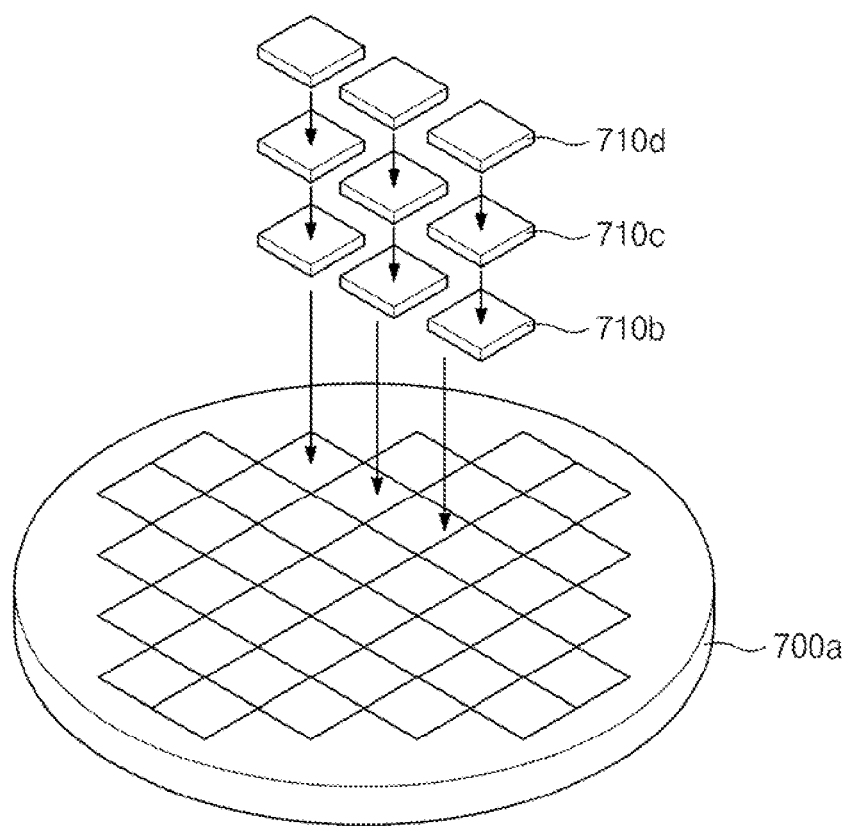
Figure 16C:
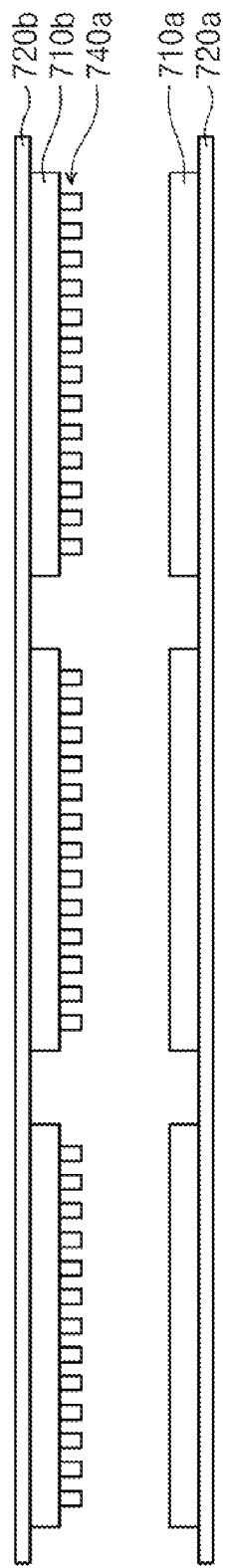

FIGS. 16A to 16C are views exemplarily illustrating fabrication methods according to exemplary embodiments of the present disclosure forming a chip stack.

Referring to FIG. 16A, a chip stack may be formed by stacking semiconductor wafers having two or more layers.

The number of stacked semiconductor wafers may be the same as the number of semiconductor chips included in one chip stack.

For example, first and second semiconductor wafers 700a and 700b may be provided where semiconductor chips including an integrated circuit and an internal wiring are formed. According to exemplary embodiments of the present disclosure, semiconductor chips formed in the first and second semiconductor wafers 700a and 700b may correspond to the first and second semiconductor chips 110a and 110b of FIG. 2A. The first and second semiconductor wafers 700a and 700b may be connected with a connection structure (not shown) disposed therebetween.

By cutting the first and second semiconductor wafers 700a and 700b that have been stacked, one chip stack may be completed. For example, the first or second chip stack of FIG. 15 may be prepared by the exemplary method of FIG. 16A. Cutting may be performed with a cutter 702 or a laser.

Referring to FIG. 16B, by sequentially stacking first to third semiconductor chips 710a to 710c prepared from at least one other semiconductor wafer (not shown), a chip stack may be formed on the first semiconductor wafer 700a. For example, such method may be used for implementing embodiments described herein with reference to FIGS. 14A and 14B.

Referring again to FIG. 14A, more specifically, the first semiconductor wafer 700a may include a plurality of uncut fourth semiconductor chips 510d. The first to third semiconductor chips 510a to 510c may be prepared by cutting another semiconductor wafer and sequentially stacking the first to third semiconductor chips 510a to 510c on the first semiconductor wafer 700a. The first semiconductor wafer 700a and the first semiconductor chip 510a may be connected through the first connection structure 540a disposed therebetween. The second and third semiconductor chips 510b and 510c may be sequentially stacked on the first semiconductor chip 510a using the second and third connection structures 540b and 540c.

Alternatively, as described above with reference to FIG. 14A, a chip stack on which the first to third semiconductor chips 510a to 510c are stacked may be stacked on the first semiconductor wafer 700a.

Referring to FIG. 16C, by sequentially stacking the first and second semiconductor chips 710a and 710b prepared from at least one wafer, a chip stack may be formed. Referring to the first chip stack of FIG. 15 as an example, the first and second semiconductor chips 410a and 410b may be connected with the connection structure 440a. As illustrated in FIG. 16C, the first and second semiconductor chips 710a and 710b may be attached to first and second support substrates 720a and 720b and conveyed, respectively. The first and second semiconductor chips 710a and 710b conveyed respectively by the first and second support substrates 720a and 720b may be connected by connection structures 740a. Each of the first and second support substrates 720a and 720b may be a tape or a glass, and formed to convey a plurality of semiconductor chips.

Figure 17:
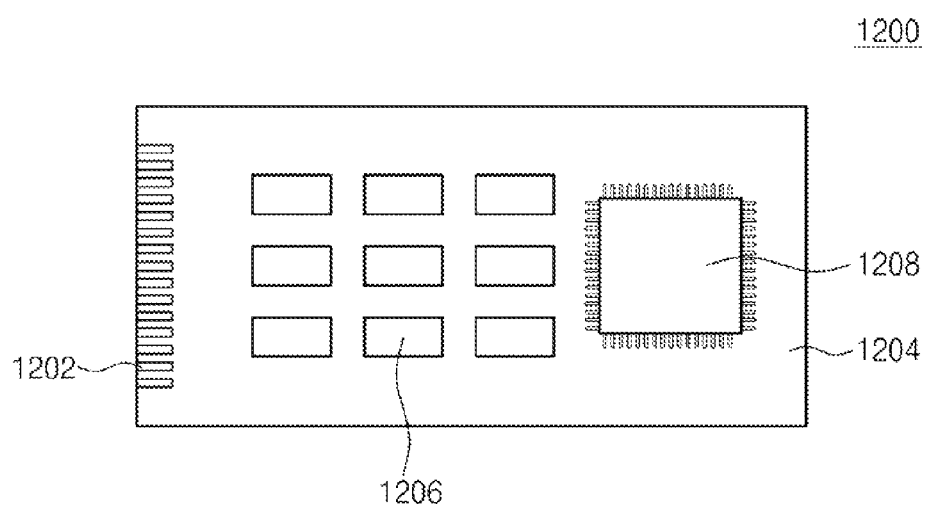
FIG. 17 is a plan view exemplarily illustrating a package module according to some embodiments of the present disclosure.

FIG. 17 is a plan view exemplarily illustrating a package module according to exemplary embodiments of the present disclosure.

Referring to FIG. 17, a package module 1200 may include a module substrate 1204. The module substrate 1204 may include an external connection terminal 1202, at least one semiconductor chip 1206 mounted on the module substrate 1204, and a Quad-Flat-Packaged (QFP) semiconductor package 1208. The semiconductor chip 1206 or the semiconductor package 1208 may include a semiconductor device according an exemplary embodiment of the present disclosure. For example, the semiconductor package 1208 may be a Multi-Chip Package (MCP) including the semiconductor device of FIG. 4. The package module 1200 may be connected to an external electronic device through the external connection terminal 1202.

Figure 18:
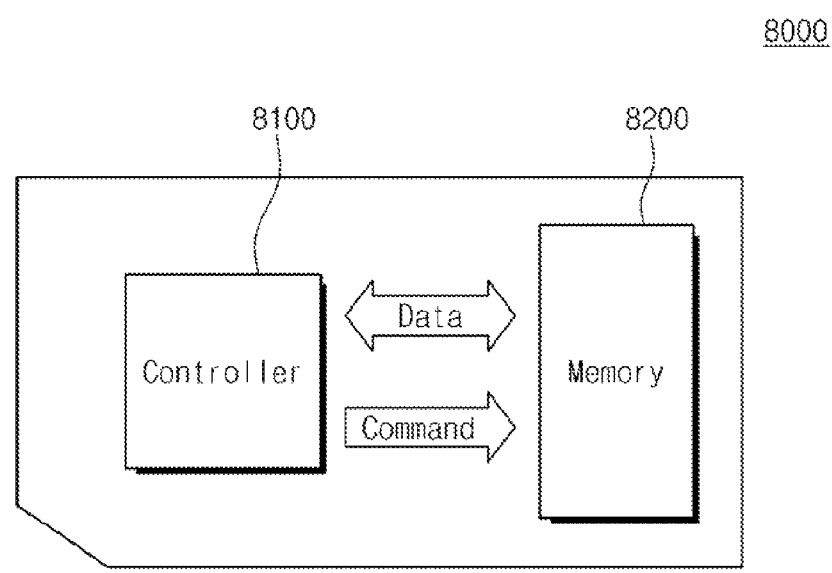
FIG. 18 is a schematic view exemplarily illustrating a memory card according to some embodiments of the present disclosure.

FIG. 18 is an exemplary schematic view illustrating a memory card according to some embodiments of the present disclosure.

Referring to FIG. 18, a memory card 8000 may include a controller 8100 and a memory 8200. The controller 8100 and the memory 8200 may exchange an electric signal. For example, the memory 8200 and the controller 8100 may exchange data "Data" according to a command "Command" of the controller 8100. Furthermore, the memory card 8000 may store data in the memory 8200, or output data from the memory 8200 to the outside.

The controller 8100 and/or the memory 8200 may be included in a semiconductor device according an exemplary embodiment of the present disclosure. For example, the controller 8100 and the memory 8200 may be included in one package and provided as a System-in Package (SiP). More specifically, a logic chip including the controller 8100 and a memory chip including the memory 8200 may be implemented as an SiP, which may include the semiconductor device that has been described above with reference to FIG. 3A. In this case, the lower structure 210c, first semiconductor chip 210a and second semiconductor chip 210b of FIG. 3A may be a package substrate, a logic chip and a memory chip, respectively. As another example, the memory card 8000 may be provided in an MCP type where a plurality of memory chips are stacked. In this case, the memory card 8000 may have an increased memory capacity. Such a multi-chip package may include the semiconductor device that has been exemplarily described with reference to FIG. 8.

The memory card 8000 according to an embodiment of the present disclosure may be used as a data storage medium in various portable devices. For example, the memory card 8000 according to an embodiment of the present disclosure may include a multimedia card (MMC) or a secure digital (SD) card.

Figure 19:
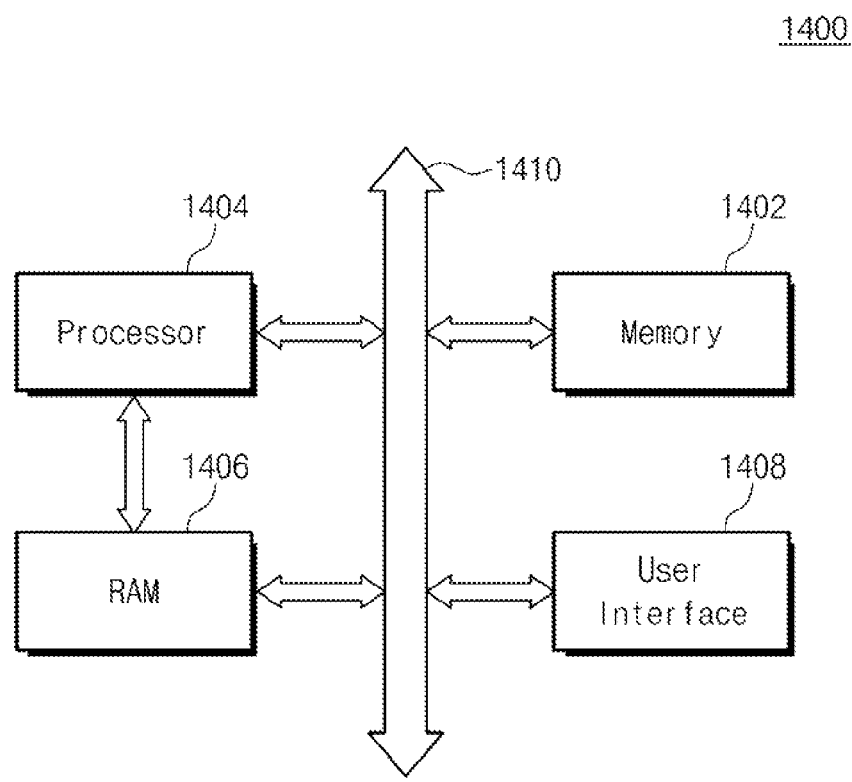
FIG. 19 is a block diagram exemplarily illustrating an electronic system according to some embodiments of the present disclosure.

FIG. 19 is a block diagram exemplarily illustrating an electronic system according to some embodiments of the present disclosure. The electronic system may include at least one semiconductor device according to exemplary embodiments of the present disclosure.

Referring to FIG. 19, an electronic system 1400 may include at least one of a memory system 1402, a processor 1404, a RAM 1406 and a user interface 1408, which may perform data communication through a bus 1410.

The processor 1404 may execute a program and control the electronic system 1400. The RAM 1406 may be used as a working memory of the processor 1404. The user interface 1408 may be used to input/output data to/from the electronic system 1400. The memory system 1402 may store computer readable instructions for operation of the processor 1404, data processed by the processor 1404, or data inputted from the outside. Furthermore, the memory system 1402 may separately include a controller and a memory. According to exemplary embodiments of the present disclosure, the memory system 1402 may be configured substantially identically or similarly to one of the memory cards 8000 that have been described above with reference to FIG. 18.

According to exemplary embodiments of the present disclosure, the processor 1404 and the RAM 1406 may be provided in an SiP type device where a plurality of chips are included in one package. For example, the processor 1404 and the RAM 1406 may configure an SiP that includes a logic chip provided for the processor 1404 and a memory chip provided for the RAM 1406. The SiP may include the semiconductor device that has been described above with reference to FIG. 3A. In this case, the lower structure 210c, first semiconductor chip and second semiconductor chip 210a and 210b of FIG. 3A may be a package substrate, logic chip and memory chip of the SiP, respectively.

The electronic system 1400 may be applied to various industrial products including electronic equipment. For example, the electronic system 1400 according to an embodiment of the present disclosure may be used as a portion of mobile phones, portable game machines, portable notebook computers, MP3 players, navigation, Solid State Disks (SSDs), vehicles or household appliances.

According to exemplary embodiments of the present disclosure, an area ratio of the connection structure connecting the semiconductor chips of the semiconductor device may vary for each layer. For example, the area ratio of the connection structure may be reduced in a subsequently stacked semiconductor chip as compared to a previously stacked semiconductor chip. In this case, since the subsequently stacked semiconductor chip is bonded by bonding force, the modification of a pre-formed connection structure and a contact error due to the modification can be suppressed or prevented. Accordingly, the plurality of semiconductor chips can be stably connected, and the operation reliability of the semiconductor device can be enhanced.

According to exemplary embodiments of the present disclosure, when the plurality of semiconductor chips are stacked, a bonding force is reduced in a subsequent bonding process as compared to a previous bonding process. In this case, a subsequent bonding force is determined in a range where a contact error does not occur due to the modification of a pre-formed connection structure, and thus the operation reliabilities of the stacked semiconductor chips can be improved.

The above-disclosed subject matter is to be considered illustrative and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is

1. A semiconductor device comprising:
   first semiconductor chip comprising an internal circuit;
   a plurality of first connection structures disposed on a first side of the first semiconductor chip, each first connection structure comprising at least one connection element electrically connected to the internal circuit of the first semiconductor chip and at least one auxiliary element electrically insulated from the internal circuit of first semiconductor chip;
   a second semiconductor chip disposed on a second side of the first semiconductor chip; and
   a plurality of second connection structures disposed between the first and second semiconductor chips, each second connection structure comprising at least one connection element electrically connected to the internal circuits of the first and second semiconductor chips.

2. The semiconductor device of claim 1, wherein the each second connection structure further comprises at least one auxiliary element electrically insulated from the internal circuit of second semiconductor chip and a number of the auxiliary elements of the second connection structures is less than a number of the auxiliary elements of the first connection structures.

3. The semiconductor device of claim 1, wherein a total number of the connection element of the plurality of the first connection structures is equal to a total number of the connection element of the plurality of the second connection structures.

4. The semiconductor device of claim 1, wherein the first semiconductor chip comprises:
   a semiconductor substrate; and
   a through via passing through the semiconductor substrate, wherein the connection element is electrically connected to the through via.

5. The semiconductor device of claim 1, wherein each of the first connection structures and the second connection structures comprises a first conductive means and a second conductive means, wherein the second conductive means includes a metallic material having a melting point lower than that of the first conductive means.

6. The semiconductor device of claim 1, wherein the number of the second connection structures is about 50% to 90% of the number of the first connection structures.

7. The semiconductor device of claim 2, wherein the number of the auxiliary elements of the second connection structures is about 50% to 90% less than the number of the auxiliary elements of the first connection structures.

8. The semiconductor device of claim 1, wherein the first and second semiconductor chips are a same kind of semiconductor chip.

9. A semiconductor device comprising:
   a lower structure; and
   a plurality of semiconductor chip floors sequentially stacked on the lower structure,
   wherein each of the semiconductor chip floors comprises a semiconductor chip and a connection structure disposed at a lower surface of the semiconductor chip, and
   wherein an area of the connection structure of each of the plurality of semiconductor chip floors is less than that of any one of the semiconductor chip floors disposed nearer the lower structure.

10. The semiconductor device of claim 9, wherein each of the semiconductor chips comprises an internal circuit disposed on the lower surface.

11. The semiconductor device of claim 9, wherein the semiconductor chips are a same kind of chip.

12. The semiconductor device of claim 9, wherein each of the semiconductor chips comprises an internal circuit, and wherein each of the connection structures comprises:
   a plurality of connection elements electrically connected to the internal circuit of the semiconductor chip of a respective semiconductor chip floor; and
   at least one auxiliary element electrically insulated from the internal circuit of the semiconductor chip of the respective semiconductor chip floor.

13. The semiconductor device of claim 12, wherein at least two of the connection structures comprise an equal number of the connection elements.

14. The semiconductor device of claim 9, wherein each of the semiconductor chips comprises an internal circuit, and wherein each of the connection structures comprises a plurality of connection elements electrically connected to the internal circuit of the semiconductor chip of a respective semiconductor chip floor.

15. The semiconductor device of claim 9, wherein the lower structure comprises a semiconductor chip.

16. The semiconductor device of claim 9, wherein the lower structure comprises a circuit substrate.

17. The semiconductor device of claim 1, wherein a number of the plurality of the second connection structures is less than a number of the plurality of the first connection structures.

* * * * *